(12) United States Patent
Shimada et al.

(10) Patent No.: US 9,548,093 B2
(45) Date of Patent: Jan. 17, 2017

(54) MAGNETIC MEMORY ELEMENT AND MAGNETIC MEMORY

(71) Applicant: Kabushiki Kaisha Toshiba, Minato-ku, Tokyo (JP)

(72) Inventors: Takuya Shimada, Kanagawa (JP); Hirofumi Morise, Kanagawa (JP); Shiho Nakamura, Kanagawa (JP); Tsuyoshi Kondo, Kanagawa (JP); Yasuaki Ootera, Kanagawa (JP); Michael Arnaud Quinsat, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/722,707

(22) Filed: May 27, 2015

(65) Prior Publication Data

US 2016/0055892 A1 Feb. 25, 2016

(30) Foreign Application Priority Data

Aug. 25, 2014 (JP) ................. 2014-170944

(51) Int. Cl.
*G11C 11/16* (2006.01)
*H01L 43/08* (2006.01)

(52) U.S. Cl.
CPC .......... *G11C 11/161* (2013.01); *G11C 11/1659* (2013.01)

(58) Field of Classification Search
CPC .......... H01L 43/02–43/08; G11C 11/14–11/16; G11C 11/161; G11C 11/1659
See application file for complete search history.

(56) References Cited

U.S. PATENT DOCUMENTS 6,834,005 B1 12/2004 Parkin
6,955,926 B2 10/2005 Chen et al.
(Continued)

FOREIGN PATENT DOCUMENTS

JP 2005-353819 12/2005
JP 2007-73103 3/2007
(Continued)

OTHER PUBLICATIONS

Office Action issued by Taiwan Patent Office on Jun. 8, 2016, in counterpart Taiwanese Patent Application No. 104117836.

*Primary Examiner* — Allison P Bernstein
(74) *Attorney, Agent, or Firm* — Finnegan, Henderson, Farabow, Garrett & Dunner LLP

(57) ABSTRACT

A magnetic memory element includes a first magnetic unit, a second magnetic unit, a third magnetic unit, a read/write unit, a first electrode, a second electrode, a third electrode, a first current source, the second current source. The third magnetic unit is connected to one end in the first direction of the first magnetic unit and one end in the first direction of the second magnetic unit. The read/write unit includes a nonmagnetic layer and a pinned layer. The nonmagnetic layer is connected to the third magnetic unit. The pinned layer is connected to the nonmagnetic layer. The first current source causes a current to flow between the third electrode and at least one of the first electrode or the second electrode. The second current source causes a current to flow between the first electrode and the second electrode.

17 Claims, 15 Drawing Sheets

(56) References Cited

U.S. PATENT DOCUMENTS

| | | |
|---|---|---|
| 7,796,415 B2 | 9/2010 | Lee et al. |
| 7,952,905 B2 * | 5/2011 | Hwang .................. G11C 11/15 |
| | | 365/171 |
| 8,300,456 B2 | 10/2012 | Honjou et al. |
| 8,559,214 B2 | 10/2013 | Fukami et al. |
| 8,792,271 B2 * | 7/2014 | Morise .................. G11C 11/16 |
| | | 365/148 |
| 2006/0227466 A1 | 10/2006 | Yagami |
| 2012/0250398 A1 | 10/2012 | Morise et al. |
| 2013/0250668 A1 | 9/2013 | Fukuzawa et al. |
| 2016/0056205 A1 * | 2/2016 | Nakamura ............ H01L 27/228 |
| | | 257/252 |

FOREIGN PATENT DOCUMENTS

| | | |
|---|---|---|
| JP | 2011-181642 | 9/2011 |
| JP | 2012-204802 | 10/2012 |
| JP | 2013-175756 | 9/2013 |
| JP | 2013-201174 | 10/2013 |

* cited by examiner

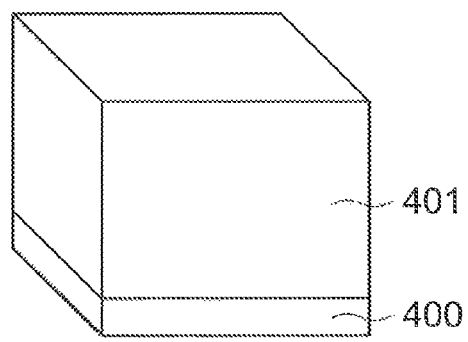
FIG. 4A
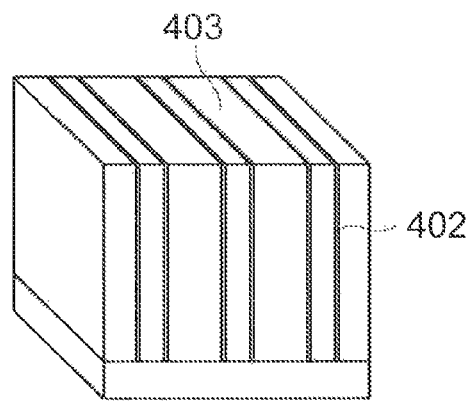
FIG. 4D
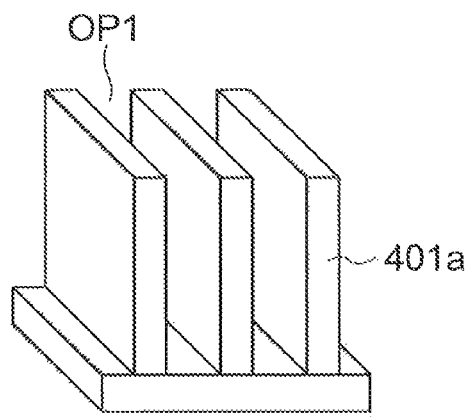
FIG. 4B
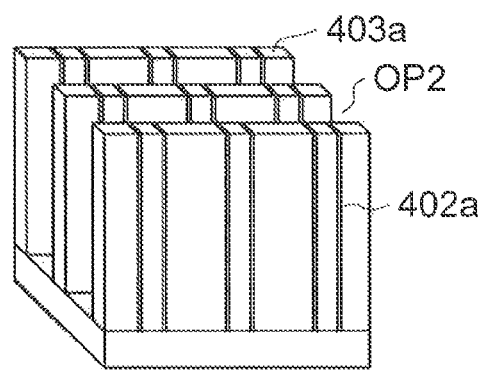
FIG. 4E
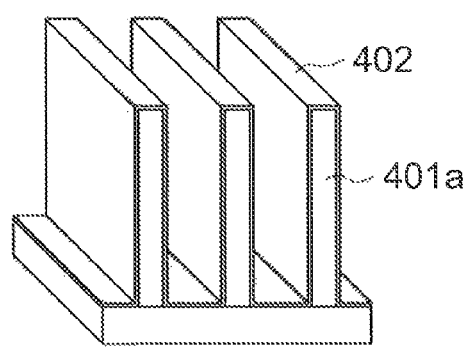
FIG. 4C
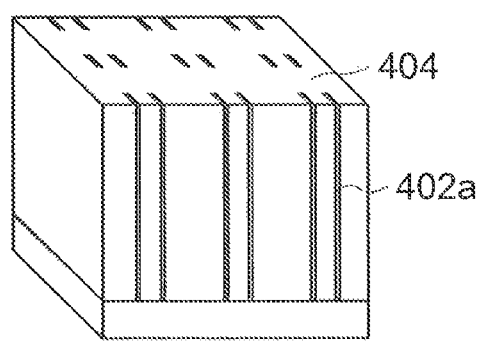
FIG. 4F
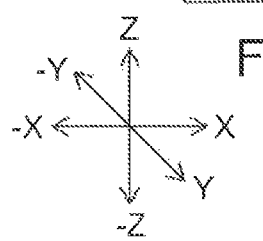

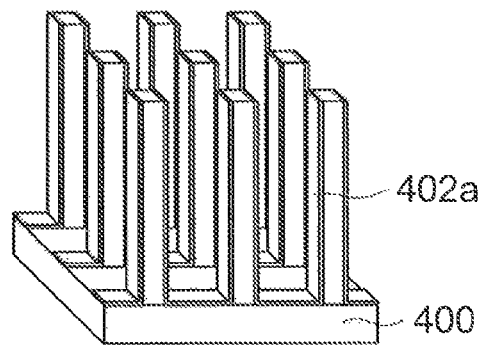
FIG. 5A
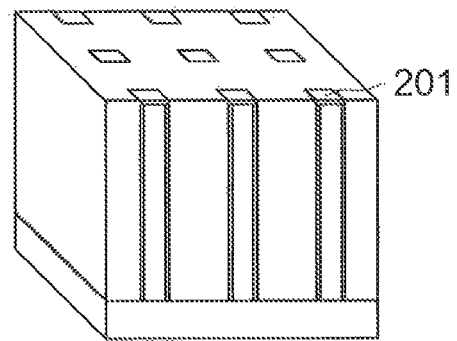
FIG. 5C
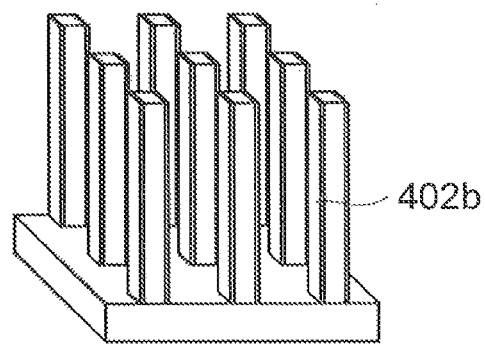
FIG. 5B
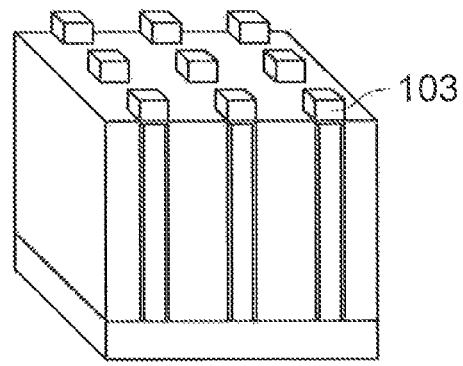
FIG. 5D
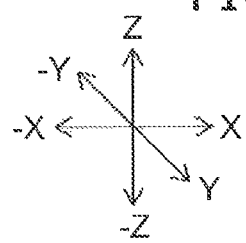

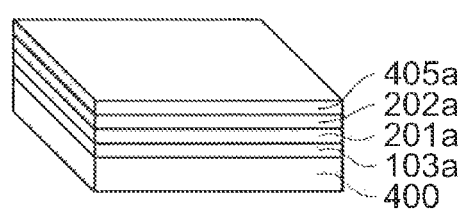
FIG. 7A
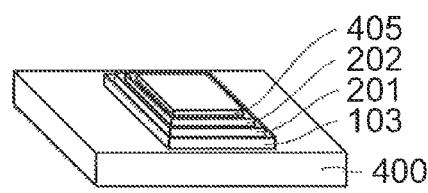
FIG. 7B
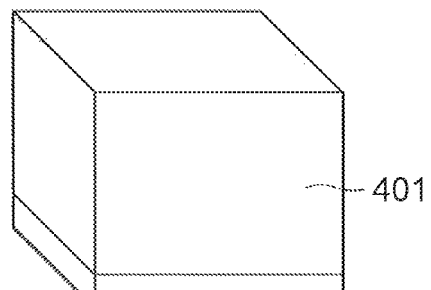
FIG. 7C
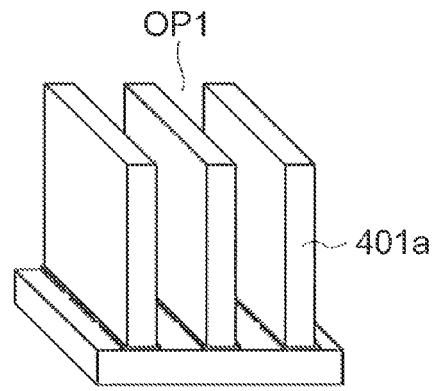
FIG. 7D
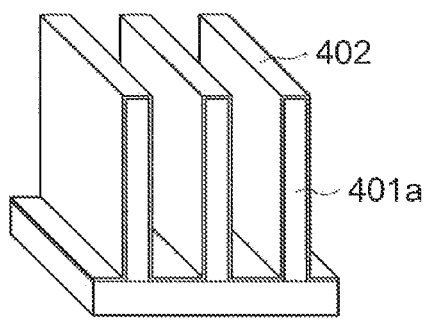
FIG. 7E
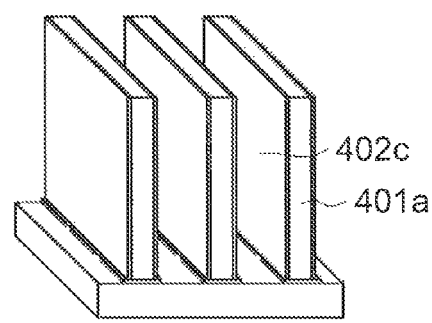
FIG. 7F
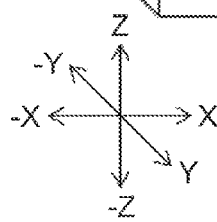

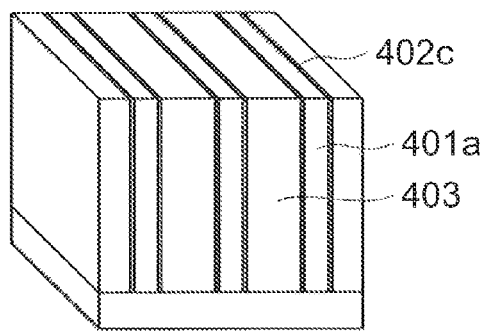
FIG. 8A
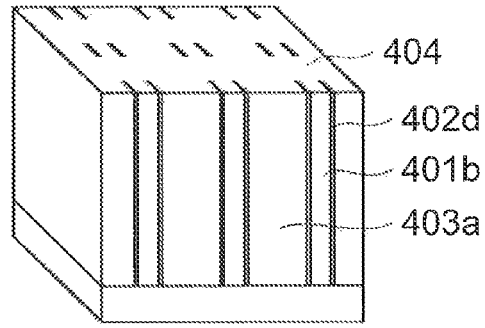
FIG. 8C
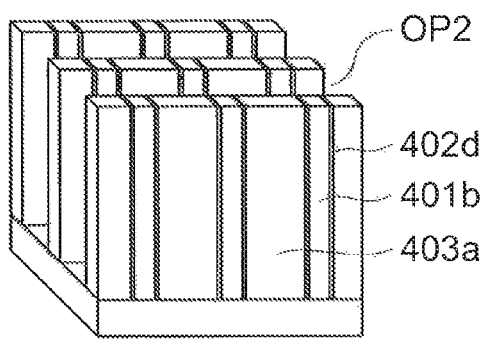
FIG. 8B
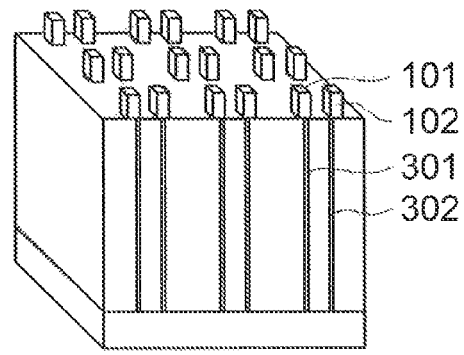
FIG. 8D
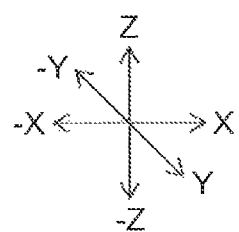

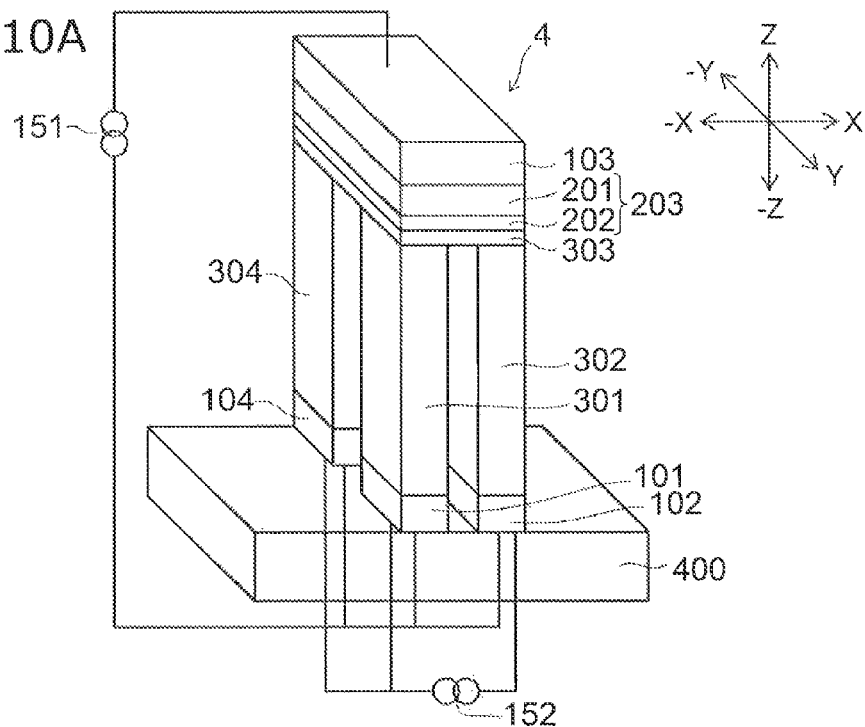
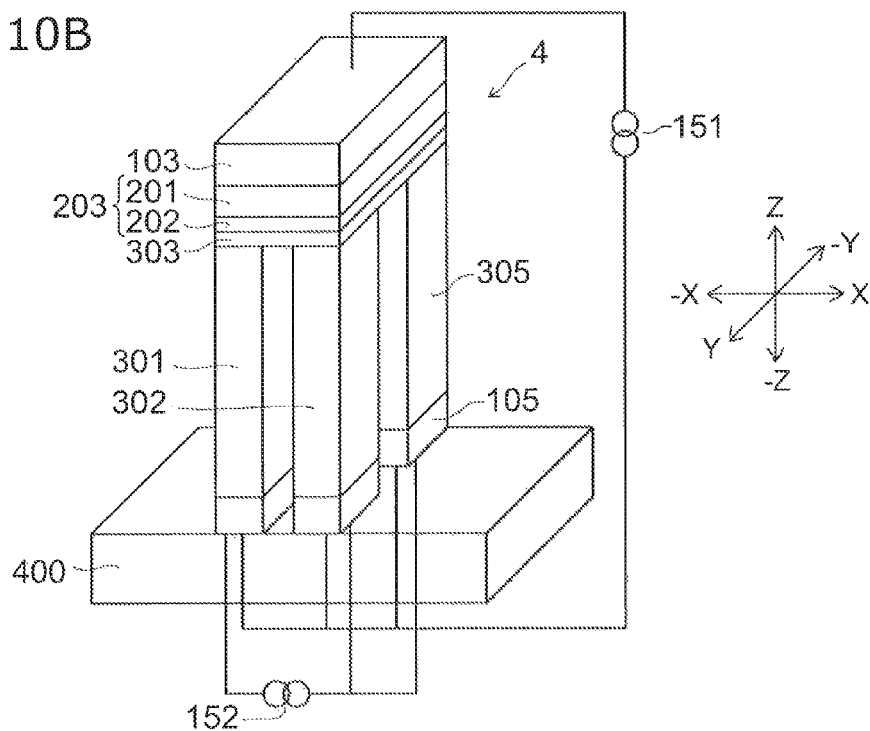

MAGNETIC MEMORY ELEMENT AND MAGNETIC MEMORY

CROSS-REFERENCE TO RELATED APPLICATIONS

This application is based upon and claims the benefit of priority from Japanese Patent Application No. 2014-170944, filed on Aug. 25, 2014; the entire contents of which are incorporated herein by reference.

FIELD

Embodiments described herein relate generally to a magnetic memory element and magnetic memory.

BACKGROUND

In recent years, a domain wall movement-type magnetic memory element that utilizes the movement of domain walls due to a current has been proposed as a method for increasing the capacity of memory. In the domain wall movement-type magnetic memory element, selection elements and interconnects are disposed along a substrate in-plane direction; and magnetic units in which the information is stored are disposed in a substrate normal direction. By disposing the magnetic units in the substrate normal direction, it is possible to suppress an increase of the cost while realizing a higher memory capacity.

However, in the domain wall movement-type magnetic memory element, technology is desirable to provide the magnetic units at a higher density to increase the memory capacity.

BRIEF DESCRIPTION OF THE DRAWINGS

FIGS. 4A to 4F and FIGS. 5A to 5D are cross-sectional views of processes, showing the manufacturing process of the magnetic memory element according to the first embodiment;

FIGS. 7A to 7F and FIGS. 8A to 8D are cross-sectional views of processes, showing the manufacturing processes of the magnetic memory element according to the second embodiment;

FIGS. 10A and 10B are perspective views of the magnetic memory element according to the fourth embodiment;

DETAILED DESCRIPTION

Figure 1:
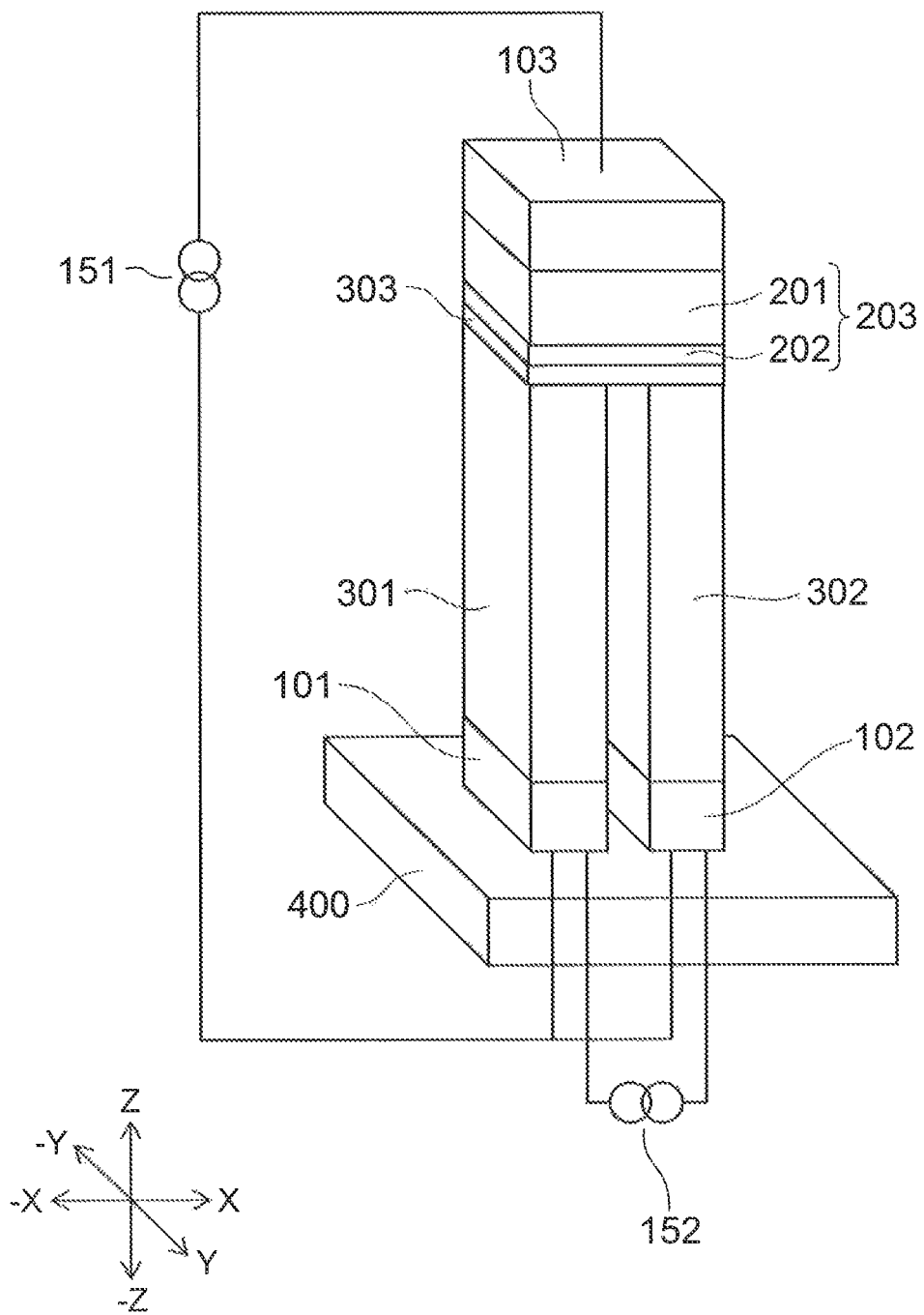
FIG. 1 is a perspective view of the magnetic memory element according to the first embodiment.

According to one embodiment, a magnetic memory element includes a first magnetic unit, a second magnetic unit, a third magnetic unit, a read/write unit, a first electrode, a second electrode, a third electrode, a first current source, the second current source. The first magnetic unit extends in a first direction. The first magnetic unit has an easy magnetization axis in a direction intersecting the first direction. The first magnetic unit is capable of retaining a plurality of magnetic domains in the first direction. The second magnetic unit is provided to be separated from the first magnetic unit. The second magnetic unit extends in the first direction. The second magnetic unit has an easy magnetization axis in a direction intersecting the first direction. The second magnetic unit is capable of retaining a plurality of magnetic domains in the first direction. The third magnetic unit is connected to one end in the first direction of the first magnetic unit and one end in the first direction of the second magnetic unit. The third magnetic unit has an easy magnetization axis in a second direction intersecting the first direction. The read/write unit includes a nonmagnetic layer and a pinned layer. The nonmagnetic layer is connected to the third magnetic unit. The pinned layer is connected to the nonmagnetic layer. The first electrode is connected to one other end in the first direction of the first magnetic unit. The second electrode is connected to one other end in the first direction of the second magnetic unit. The third electrode is connected to the read/write unit. The first current source causes a current to flow between the third electrode and at least one of the first electrode or the second electrode. The second current source causes a current to flow between the first electrode and the second electrode.

DESCRIPTION OF EMBODIMENTS

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

Although the words "up" or "down" are used in the description of the embodiments, such words mean relative positional relationships and do not mean absolute positional relationships.

In some of the drawings, the magnetization directions of components including magnetic materials are illustrated by arrows in the components.

In the description of the embodiments, the state in which two directions are parallel to each other and oriented in the same direction is called "parallel"; and the state in which the two directions are parallel to each other and oriented in opposite directions is called "antiparallel."

In the description of the embodiments, an X-axis direction and a Y-axis direction are directions intersecting a Z-axis direction. The case is described as an example in the embodiments hereinbelow where the X-axis direction, the Y-axis direction, and the Z-axis direction are directions orthogonal to each other.

The X-axis direction includes the X-direction (a second direction) and the −X direction. The Y-axis direction includes the Y-direction (a third direction) and the −Y direction. The Z-axis direction includes the Z-direction (a first direction) and the −Z direction.

First Embodiment

A magnetic memory element 1 according to a first embodiment will now be described using FIG. 1.

FIG. 1 is a perspective view of the magnetic memory element according to the first embodiment.

The magnetic memory element 1 includes a first magnetic unit 301, a second magnetic unit 302, a third magnetic unit 303, a read/write unit 203, a first electrode 101, a second electrode 102, a third electrode 103, a first current source 151, and a second current source 152.

The first magnetic unit 301 and the second magnetic unit 302 extend in the Z-axis direction. One Z-axis direction end of the first magnetic unit 301 is connected to the third magnetic unit 303. The other Z-axis direction end of the first magnetic unit 301 is connected to the first electrode 101. One Z-axis direction end of the second magnetic unit 302 is connected to the third magnetic unit 303. The other Z-axis direction end of the second magnetic unit 302 is connected to the second electrode 102. The first magnetic unit 301 is provided to be separated from the second magnetic unit 302. For example, the first magnetic unit 301 is connected to one X-axis direction end of the lower surface of the third magnetic unit 303. For example, the second magnetic unit 302 is connected to the other X-axis direction end of the lower surface of the third magnetic unit 303. The first magnetic unit 301 is capable of retaining multiple magnetic domains in the Z-axis direction. The second magnetic unit 302 is capable of retaining multiple magnetic domains in the Z-axis direction. The first magnetic unit 301 and the second magnetic unit 302 have easy magnetization axes in a direction intersecting the Z-axis direction. It is favorable for the first magnetic unit 301 and the second magnetic unit 302 to have easy magnetization axes in a direction orthogonal to the Z-axis direction.

The read/write unit 203 includes a pinned layer 201 and a nonmagnetic layer 202. The third electrode 103 is connected to the pinned layer 201 provided at the lower portion of the third electrode 103. The pinned layer 201 is connected to the nonmagnetic layer 202 provided at the lower portion of the pinned layer 201.

The read/write unit 203 is connected to the third magnetic unit 303 provided at the lower portion of the pinned layer 201. For example, the third magnetic unit 303 extends in the X-axis direction intersecting the Z-axis direction. The direction of the easy magnetization axis of the third magnetic unit 303 is, for example, the X-axis direction. The direction of the easy magnetization axis of the third magnetic unit 303 may be a direction parallel to the connection surface between the read/write unit 203 and the third magnetic unit 303.

The pinned layer 201, the nonmagnetic layer 202, and the third magnetic unit 303 are, for example, thin films stacked in the Z-axis direction of FIG. 1.

Hereinbelow, a magnetic film that has an easy magnetization axis in the in-plane direction is called an in-plane magnetization film.

The first magnetic unit 301 and the second magnetic unit 302 are, for example, layers deposited in a plane (hereinbelow, called the Y-Z plane) including the Y-axis direction and the Z-axis direction. The first magnetic unit 301 and the second magnetic unit 302 have easy magnetization axes in a direction (the X-axis direction) perpendicular to the in-plane direction of the deposited layers. Although the cross sections of the first magnetic unit 301 and the second magnetic unit 302 in a direction orthogonal to the Z-axis direction are, for example, rectangles, the cross sections may have other configurations. Hereinbelow, a magnetic film having an easy magnetization axis in a direction perpendicular to the in-plane direction is called a perpendicular magnetization film.

It is favorable for the easy magnetization axes of the first magnetic unit 301, the second magnetic unit 302, and the third magnetic unit 303 to be parallel to each other.

The third electrode 103 and at least one of the first electrode 101 or the second electrode 102 are connected to the first current source 151. The first current source 151 performs the reading and writing of magnetization information from and to the third magnetic unit 303 by causing a current to flow between the third electrode 103 and at least one of the first electrode 101 or the second electrode 102.

The first electrode 101 and the second electrode 102 are connected to the second current source 152. The second current source 152 causes the magnetic domains (the domain walls) included in the first magnetic unit 301 and the second magnetic unit 302 to move by causing a current to flow between the first electrode 101 and the second electrode 102.

For example, these components are formed on a substrate 400.

Memory Operation

A shift operation of the magnetic domains of the magnetic memory element 1 according to the first embodiment will now be described using FIG. 2.

Figure 2:
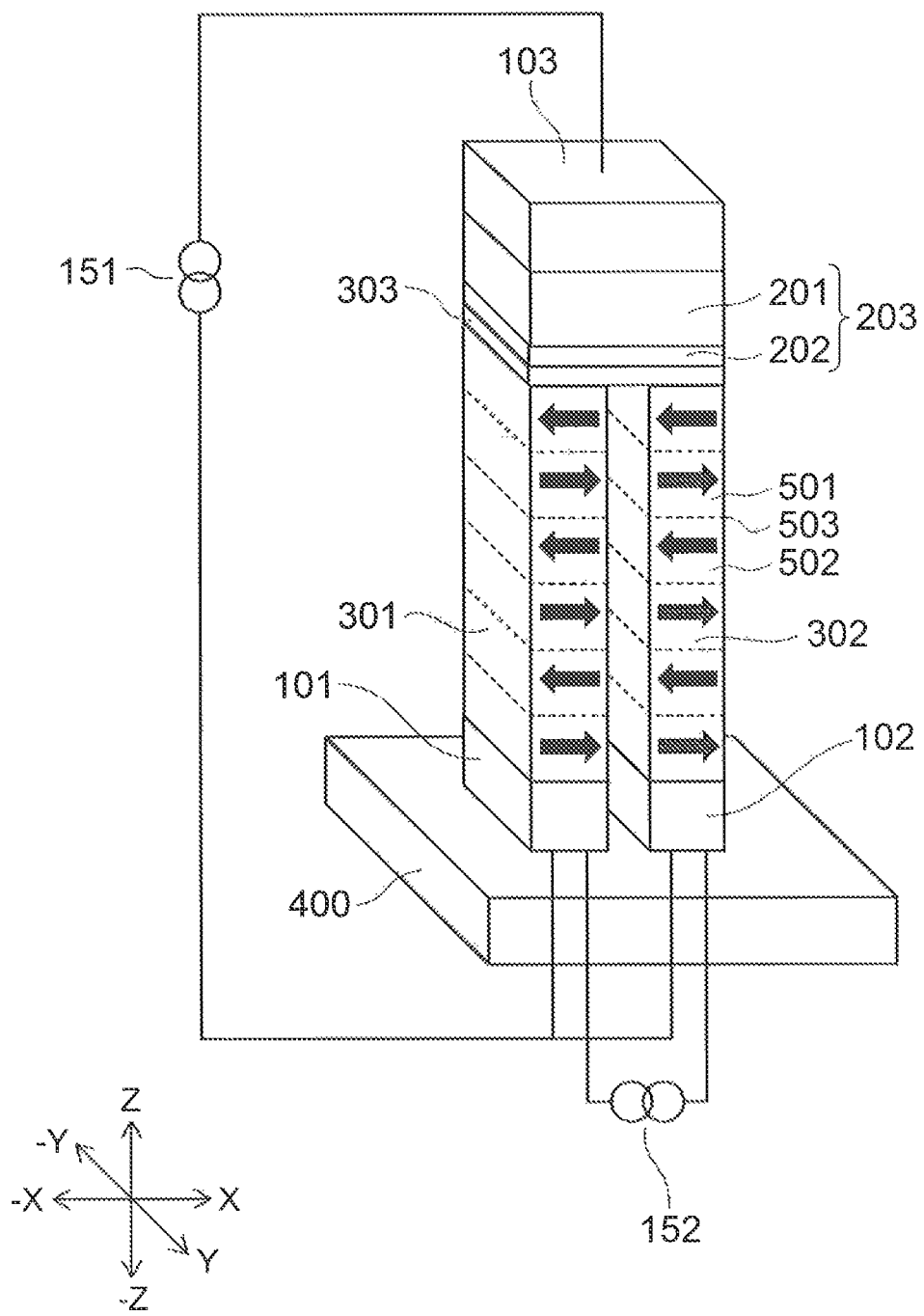
FIG. 2 is a schematic view describing the shift operation of the magnetic domains of the magnetic memory element according to the first embodiment.

FIG. 2 is a schematic view describing the shift operation of the magnetic domains of the magnetic memory element according to the first embodiment.

The multiple magnetic domains are formed in the connection direction in the first magnetic unit 301, the second magnetic unit 302, and the third magnetic unit 303 that are connected continuously. For example, a magnetic domain 501 that is magnetized in the X-direction and a magnetic domain 502 that is magnetized in the direction opposite to the X-direction exist in each of the magnetic units. The first magnetic unit 301, the second magnetic unit 302, and the third magnetic unit 303 can function as memory units by associating the magnetization direction of each magnetic domain with "0" or "1". A domain wall 503 exists at the boundary between the magnetic domain of "0" and the magnetic domain of "1".

The second current source 152 causes the multiple magnetic domains included in the first magnetic unit 301, the second magnetic unit 302, and the third magnetic unit 303 to move by causing a current to flow between the first electrode 101 and the second electrode 102. By utilizing this movement, the magnetic bit (the magnetic domain) to be recorded/reproduced is moved to the position (i.e., the third magnetic unit 303) directly under the read/write unit 203.

The movement direction of the magnetic bits can be adjusted to be the same direction of the current or the reverse direction of the current by the materials and film configurations of the first magnetic unit 301 and the second magnetic unit 302.

The connection portion between the first magnetic unit 301 and the third magnetic unit 303 is bent. Similarly, the connection portion between the second magnetic unit 302 and the third magnetic unit 303 is bent. In the case where the third magnetic unit 303 is a perpendicular magnetization film, a large energy is necessary to cause the domain walls to pass through the connection portions because the easy magnetization axis also bends 90 degrees at the connection portions. Therefore, compared to when the domain walls move through the first magnetic unit 301 and through the second magnetic unit 302, a larger current is necessary to move the domain walls when the domain walls pass through the connection portions.

Conversely, in the embodiment, the first magnetic unit 301 and the second magnetic unit 302 are perpendicular magnetization films extending in the Z-axis direction; and the third magnetic unit 303 is an in-plane magnetization film extending in a direction intersecting the Z-axis direction. In such a case, compared to the case where the first to third magnetic units 301 to 303 are perpendicular magnetization films, a smaller energy is necessary for the domain walls to pass through the connection portions because the direction of the easy magnetization axis does not change at the connection portions. Therefore, the domain walls can be moved by a low current even in the case where the connection portions are bent.

The energy of the domain wall at the bend is the smallest in the case where the easy magnetization axis directions of the first magnetic unit 301, the second magnetic unit 302, and the third magnetic unit 303 are the same. Therefore, it is favorable for the easy magnetization axis directions of the first magnetic unit 301, the second magnetic unit 302, and the third magnetic unit 303 to be the same direction.

The writing operation and the read-out operation of the magnetic memory element 1 according to the first embodiment will now be described using FIG. 3.

Figure 3:
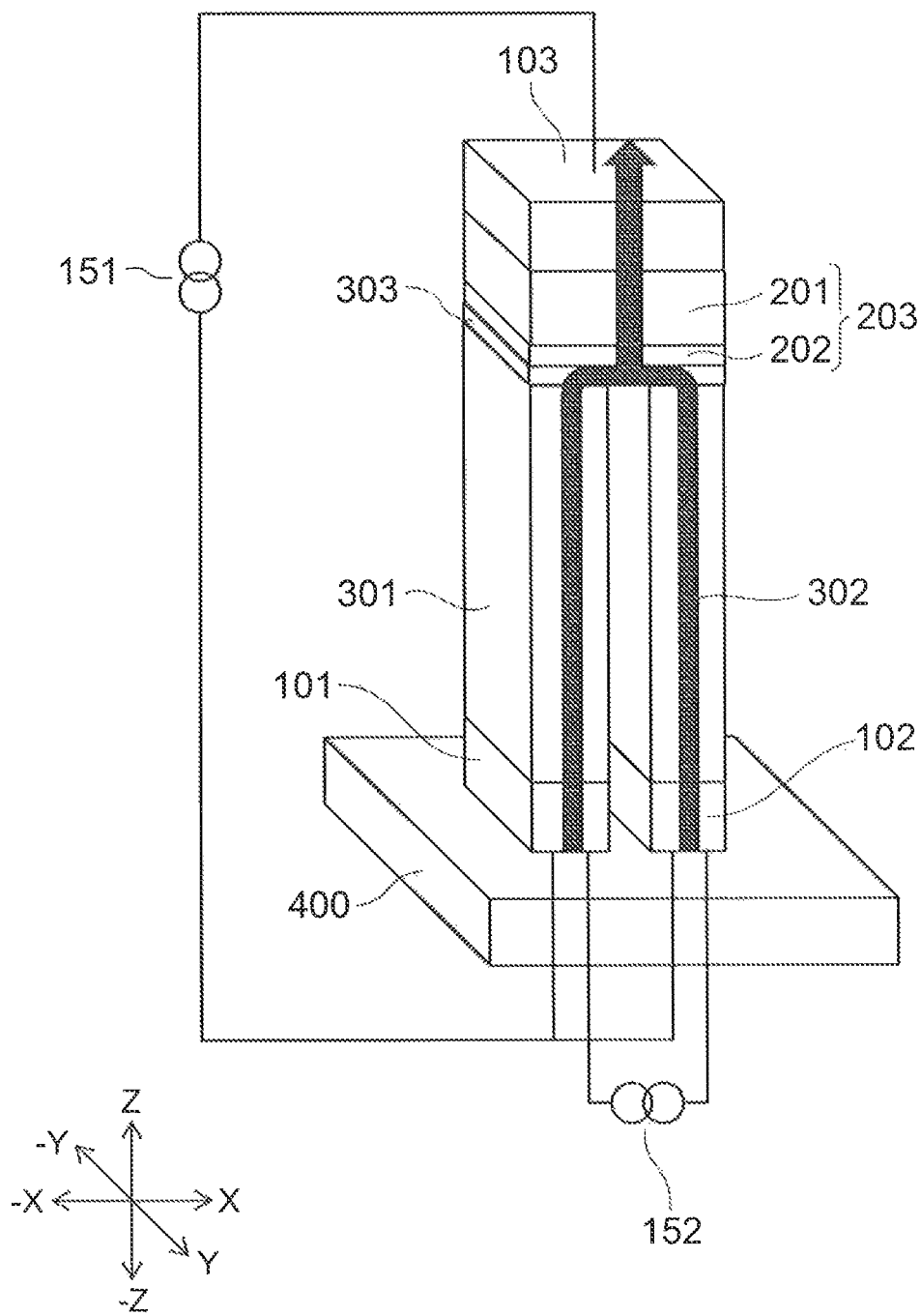
FIG. 3 is a schematic view describing the writing operation and the read-out operation of the magnetic information of the magnetic memory element according to the first embodiment.

FIG. 3 is a schematic view describing the writing operation and the read-out operation of the magnetic information of the magnetic memory element 1 according to the first embodiment.

First, the case where will be described where a magnetic bit having a magnetization direction in the same direction as the magnetization direction of the pinned layer 201 is written to the third magnetic unit 303. In such a case, the current is caused to flow toward the third electrode 103 from at least one of the first electrode 101 or the second electrode 102. Here, as illustrated in FIG. 3, the case is considered as an example where the current is caused to flow toward the third electrode 103 from both the first electrode 101 and the second electrode 102. Because the electrons flow in the reverse orientation of the current, a portion of the electrons flow from the third electrode 103 through the pinned layer 201, the nonmagnetic layer 202, the third magnetic unit 303, and the first magnetic unit 301 toward the first electrode 101. Another portion of the electrons flows from the third electrode 103 through the pinned layer 201, the nonmagnetic layer 202, the third magnetic unit 303, and the second magnetic unit 302 toward the second electrode 102.

The electrons are spin-polarized when passing through the pinned layer 201. The spin-polarized electrons flow through the nonmagnetic layer 202 into the region of the third magnetic unit 303 where the writing is to be performed. When the spin-polarized electrons have a spin in the same direction as the region where the writing is to be performed, the spin-polarized electrons pass through the region where the writing is to be performed. However, when the spin-polarized electrons have a spin in a direction different from the magnetization direction of the region where the writing is to be performed, a spin torque is applied to the magnetization of the region where the writing is to be performed. The spin torque that is applied to the magnetization of the region where the writing is to be performed acts to cause the magnetization direction of the region where the writing is to be performed to be oriented in the same direction as the magnetization direction of the pinned layer 201.

In other words, in the case where the magnetization direction of the pinned layer 201 and the magnetization direction of the region where the writing is to be performed are the same, the spin-polarized electrons pass through without applying a spin torque to the region where the writing is to be performed. On the other hand, in the case where the magnetization direction of the pinned layer 201 and the magnetization direction of the region where the writing is to be performed are different, the spin-polarized electrons apply a spin torque to the region where the writing is to be performed when passing through.

Thus, the magnetization of the region where the writing is to be performed is controlled to be oriented in the same direction as the magnetization of the pinned layer 201.

The case will now be described where a direction that is different from the magnetization direction of the pinned layer 201 is written to the magnetic bit of the third magnetic unit 303. In such a case, the current that is caused to flow in the magnetic bit of the third magnetic unit 303 is in the reverse direction of the case where the same direction as the magnetization direction of the pinned layer 201 is written. In other words, electrons are caused to flow from the first electrode 101 via the first magnetic unit 301, the third magnetic unit, the nonmagnetic layer 202, and the pinned layer 201 toward the third electrode 103. Simultaneously, electrons are caused to flow from the second electrode 102 via the second magnetic unit 302, the third magnetic unit, the nonmagnetic layer 202, and the pinned layer 201 toward the third electrode 103.

When the electrons have a spin in the same direction as the magnetization of the pinned layer 201 when passing through the pinned layer 201, the electrons pass through the pinned layer 201. However, when the electrons have a spin in a direction different from the magnetization of the pinned layer 201, the electrons are reflected by the interface between the pinned layer 201 and the nonmagnetic layer 202 and flow into the region of the third magnetic unit 303 where the writing is to be performed. The electrons that have the spin in the direction different from the magnetization of the pinned layer 201 apply a spin torque to the magnetization of the region of the third magnetic unit 303 where the writing is to be performed. The spin torque that is applied to the magnetization of the region where the writing is to be performed acts to cause the magnetization direction of the region where the writing is to be performed to be oriented in the direction that is different from the magnetization direction of the pinned layer 201. Thereby, the magnetization of the region where the writing is to be performed is controlled to be oriented in the direction that is different from the magnetization of the pinned layer 201.

The case where the magnetic bit of the third magnetic unit 303 is read will now be described.

When reading, a constant current is caused to flow or a constant electrical potential is applied between the third electrode 103 and the first electrode 101 and the second electrode 102. At this time, the electrical resistance between the third electrode 103 and the first electrode 101 and the second electrode 102 changes due to the angle between the magnetization direction of the pinned layer 201 and the magnetization direction of the region of the third magnetic unit 303 where the reading is to be performed. Specifically, the resistance value recited above is a low value when the magnetization direction of the pinned layer 201 and the magnetization direction of the region where the reading is to be performed are the same. The resistance value recited above is a high value when the magnetization direction of the pinned layer 201 and the magnetization direction of the region where the reading is to be performed are different. This phenomenon is called the magnetoresistance effect. By sensing the resistance value using this phenomenon, the magnetization direction of the region where the reading is to be performed is sensed; and the reading of the information is performed.

In the embodiment, the current when performing the read-out operation and the writing operation flows between one electrode (the third electrode 103) and two electrodes (the first electrode 101 and the second electrode 102) as described above. Therefore, the currents flowing in the first magnetic unit 301 and the second magnetic unit 302 in the read-out operation and in the writing operation are ½ of those in the case where the current flows between one pair of electrodes. By reducing the current value flowing in the first magnetic unit 301 and the second magnetic unit 302 in the read-out operation and in the writing operation, the likelihood of the domain walls included in the first magnetic unit 301 and the second magnetic unit 302 erroneously shifting in the read-out operation and in the writing operation can be reduced.

In the embodiment, the first magnetic unit 301 and the second magnetic unit 302 are provided to be symmetric with respect to the third magnetic unit 303. In other words, the second magnetic unit 302 is capable of retaining the same amount of magnetic bits as the first magnetic unit 301. Therefore, all of the magnetic bits recorded in one of the magnetic units can be shifted into the other magnetic unit; and the magnetic bits can be retained in the other magnetic unit.

Conversely, in the case where the magnetic memory element is configured so that the read/write element is provided at one end of one magnetic unit, the magnetic bit that reaches the region directly under the read/write element (i.e., the end portion of the magnetic unit) is lost in the read-out operation or the writing operation. Therefore, it is necessary to store the information in another memory element to prevent the loss of the magnetic bits.

However, according to the configuration of the embodiment, the magnetic bits are not lost because the magnetic bits can be retained by the other magnetic unit when performing the reading or the writing of the magnetic bits of the one of the magnetic units.

Accordingly, it is unnecessary to separately provide another external memory element to retain the lost information as in the magnetic memory element described above.

In the embodiment, the current is caused to flow between the third electrode 103 and at least one of the first electrode 101 or the second electrode 102 when performing the reading and the writing of the magnetic bits from and to the third magnetic unit 303.

Accordingly, for example, compared to a magnetic memory element in which a fourth electrode is provided at the lower portion of the third magnetic unit 303 and the reading and the writing of the magnetic bits are performed by causing the current to flow between the fourth electrode and the third electrode 103, the first magnetic unit 301 and the second magnetic unit 302 can be disposed to be more proximal to each other. Therefore, according to the magnetic memory element 1 according to the embodiment, it Is possible to provide the magnetic units at a higher density.

Details of the Magnetic Units

More detailed structures of the first magnetic unit 301, the second magnetic unit 302, and the third magnetic unit 303 according to the embodiment will now be described based on the read-out operation and the writing operation described above.

In the embodiment, the surface area of the third magnetic unit 303 in a plane (hereinbelow, called the X-Y plane) including the X-axis direction and the Y-axis direction is the same as or less than the surface area of the read/write unit 203 in the X-Y plane. The first magnetic unit 301 and the second magnetic unit 302 that extend in the Z-axis direction are connected to the lower surface of the third magnetic unit 303. Therefore, the surface area of the magnetic memory element 1 is equal to the surface area of the read/write unit 203 as viewed from above (the Z-axis direction).

It is also necessary to downsize the read/write unit 203 when increasing the memory capacity. Accordingly, it is favorable to reduce the sizes of the first magnetic unit 301, the second magnetic unit 302, and the third magnetic unit 303 as well. In a general in-plane magnetization film such as permalloy (an FeNi alloy), etc., the size of one magnetic domain is about 200 nm. Therefore, the third magnetic unit 303 can have a single magnetic domain structure by setting the length of the long side (the side in the X-axis direction) of the third magnetic unit 303 to be 200 nm or less. In such a case, a domain wall does not exist in the third magnetic unit 303 except in the shift operation of the magnetic domains of the magnetic memory element 1. Accordingly, the shift current value that is necessary when starting the shift operation is equal to the current value that is necessary to move the domain walls included in the first magnetic unit 301 and the second magnetic unit 302 which are perpendicular magnetization films. Generally, the threshold shift current (the threshold of the current necessary to start moving the domain walls) is smaller for a perpendicular magnetization film than for an in-plane magnetization film. Therefore, it is possible to reduce the threshold shift current by setting the length of the third magnetic unit 303 so that the third magnetic unit 303 has a single magnetic domain structure.

The first magnetic unit 301 and the second magnetic unit 302 may include portions (pinched-in portions) having narrow widths that are provided periodically in the Z-axis direction. The width is the dimension in a direction orthogonal to the direction (the Z-axis direction) in which the magnetic units extend. The energy at which the domain wall exists can be set to be lower in the portions of the magnetic units having the narrow widths than in the portions of the magnetic units having the wide widths. Therefore, the domain walls stop stably at the portions having the narrow widths even in the case where there is fluctuation of the time that the current flows to shift the domain walls. Accordingly, by providing the pinched-in portions in the magnetic units periodically at spacing corresponding to one bit length, it is possible to cause the domain walls to exist stably at the pinched-in portions after the shift operation of the domain walls. As a result, even in the case where there is fluctuation in the time of shifting the domain walls, the occurrence of errors of the read-out operation and/or the writing operation caused by the fluctuation of the positions of the domain walls can be suppressed.

In the case where a pinched-in portion is provided at the end portion vicinity of the first magnetic unit 301, the domain walls stop stably at the pinched-in portion of the end portion vicinity of the first magnetic unit 301. Similarly, in the case where a pinched-in portion is provided at the end portion vicinity of the second magnetic unit 302, the domain walls stop stably at the pinched-in portion of the end portion vicinity of the second magnetic unit 302. In such a case, one magnetic bit having the same magnetization direction is formed of the third magnetic unit 303, the end portion vicinity of the first magnetic unit 301, and the end portion vicinity of the second magnetic unit 302. Thereby, in the writing operation, the spin torque acts on the third magnetic unit 303, the end portion vicinity of the second magnetic unit 302, and the end portion vicinity of the first magnetic unit 301 in the same direction. Therefore, the occurrence frequency of the writing errors can be lower than in the case where domain walls exist at the connection portion between the first magnetic unit 301 and the third magnetic unit 303 and at the connection portion between the second magnetic unit 302 and the third magnetic unit 303, and the magnetization direction of the magnetic bit of the third magnetic unit 303 is different from the magnetization directions of the magnetic bits of the end portion vicinity of the first magnetic unit 301 and the end portion vicinity of the second magnetic unit 302.

Materials of Components

The pinned layer 201, the first magnetic unit 301, the second magnetic unit 302, and the third magnetic unit 303 may include various magnetic materials. For example, a magnetic alloy including at least one element selected from the group consisting of Fe, Co, Ni, Mn, and Cr may be used.

Permalloy (an FeNi alloy), a CoFe alloy, etc., are typical examples. Co, CoPt, CoCrPt, etc., are examples of materials having an easy axis of the magnetic anisotropy in the in-plane direction that can be included in the pinned layer 201 and the third magnetic unit 303. CoPt and CoCrPt may be an alloy. Added elements may be added to any of the material groups recited above.

It is desirable for the first magnetic unit 301 and the second magnetic unit 302 to include a magnetic material that has a large uniaxial anisotropy constant Ku and perpendicular magnetic anisotropy. In the case where a material having a large anisotropy constant Ku is used, the spacing between the domain walls when neither a magnetic field nor a current is applied can be set to be narrow. Therefore, the density of the magnetic domains included in the first magnetic unit 301 and the second magnetic unit 302 can be higher. An alloy that includes at least one element selected from the group consisting of Fe, Co, Ni, Mn, and Cr and at least one element selected from the group consisting of Pt, Pd, Ir, Ru, and Rh is an example of such a material. The value of the uniaxial anisotropy constant Ku can be adjusted by the composition of the magnetic material included in the magnetic layer, the crystalline order due to heat treatment, etc.

For example, the Co layer and the CoPt layer have perpendicular magnetizations due to the interface magnetic anisotropy of the foundation film in the case where the film thicknesses of the Co layer and the CoPt layer are 2 nm or less.

The first magnetic unit 301 and the second magnetic unit 302 may include a magnetic material having a perpendicular magnetic anisotropy and a hcp (hexagonal close-packed) crystal structure. A Co layer, a CoPt layer, an FePt layer, a stacked film of Co/Ni, a TbFe layer, etc., are examples of such magnetic materials. CoPt may be an alloy. The TbFe layer has a perpendicular anisotropy in the case where Tb is not less than 20 atomic % and not more than 40 atomic %. An added element may be added to any of the material groups recited above. The perpendicular magnetic anisotropy can be adjusted by inserting Pt, Ru, Pd, Ta, TaN, TiN, or W as the foundation film of the material groups recited above. Also, a material that has a perpendicular magnetic anisotropy and is an alloy of a rare-earth element and an iron group transition element may be used. Specifically, GdFe, GdCo, GdFeCo, TbFe, TbCo, TbFeCo, GdTbFe, GdTbCo, DyFe, DyCo, DyFeCo, etc., are examples.

The magnetic properties of the magnetic materials included in the pinned layer 201, the first magnetic unit 301, the second magnetic unit 302, and the third magnetic unit 303 may be adjusted by adding a nonmagnetic element such as Ag, Cu, Au, Al, Mg, Si, Bi, Ta, B, C, O, N, Pd, Pt, Zr, Ir, W, Mo, Nb, H, etc. Or, various characteristics such as the crystallinity, the mechanical properties, the chemical properties, etc., may be adjusted by adding such nonmagnetic elements.

The magnetic properties of the in-plane magnetization film of the third magnetic unit 303 and the magnetic properties of the perpendicular magnetization films of the first magnetic unit 301 and the second magnetic unit 302 may be adjusted by selecting the materials described above, etc., to provide an optimal shift operation, read-out operation, and writing operation.

In the embodiment, each of the magnetic domains included in the first magnetic unit 301, the second magnetic unit 302, and the third magnetic unit 303 are magnetized in the X-axis direction. The dimension in the X-axis direction of the third magnetic unit 303 is longer than the dimensions in the X-axis direction of the first magnetic unit 301 and the second magnetic unit 302. Therefore, the current that is necessary to shift the domain walls through the third magnetic unit 303 is large compared to the current that is necessary to shift the domain walls through the first magnetic unit 301 and the second magnetic unit 302. It is favorable for the magnetization of the third magnetic unit 303 to be smaller than the magnetizations of the first magnetic unit 301 and the second magnetic unit 302 to reduce the difference between the current that is necessary to shift the domain walls through the third magnetic unit 303 and the current that is necessary to shift the domain walls through the first magnetic unit 301 and the second magnetic unit 302. The shift current that is necessary to shift the domain walls of the third magnetic unit 303 can be reduced by setting the magnetization of the third magnetic unit 303 to be small.

To fix the magnetization of the pinned layer 201, an antiferromagnetic layer may be provided to be adjacent to the pinned layer 201. It is desirable for Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, a magnetic semiconductor, etc., to be used as the material of the antiferromagnetic layer.

A nonmagnetic metal material or a nonmagnetic insulating material may be used as the material of the nonmagnetic layer 202. As the nonmagnetic metal, at least one element Au, Cu, Cr, Zn, Ga, Nb, Mo, Ru, Pd, Ag, Hf, Ta, W, Pt, or Bi or an alloy including one or more types of these elements may be used. It is necessary for the magnetostatic coupling between the pinned layer 201 and the third magnetic unit 303 to be sufficiently small and for the thickness of the nonmagnetic layer 202 to be less than the spin diffusion length of the nonmagnetic layer 202; and specifically, it is desirable for the thickness to be within a range not less than 0.2 nm and not more than 20 nm.

As the insulating material, $Al_2O_3$, $SiO_2$, MgO, AlN, $Bi_2O_3$, $MgF_2$, $CaF_2$, $SrTIO_3$, $AlLaO_3$, Al—N—O, Si—N—O, a nonmagnetic semiconductor (ZnO, InMn, GaN, GaAs, $TiO_2$, Zn, Te, or one of these compounds doped with a transition metal), etc., may be used. It is unnecessary for these compounds to have completely precise stoichiometric compositions; and deficiencies or excessive/insufficient oxygen, nitrogen, fluorine, etc., may exist. It is desirable for the thickness of the nonmagnetic layer made of the Insulating material to be within a range not less than 0.2 nm and not more than 5 nm.

Method for Manufacturing

A method for manufacturing the magnetic memory element 1 according to the first embodiment will now be described using FIGS. 4A to 4F and FIGS. 5A to 5D.

FIGS. 4A to 4F and FIGS. 5A to 5D are cross-sectional views of processes, showing the manufacturing process of the magnetic memory element 1 according to the first embodiment.

First, as shown in FIG. 4A, an insulating layer 401 (a first insulating layer) is formed on the substrate 400 in which structures necessary for the memory operations such as transistors, interconnects, etc., are provided. The first electrode 101 and the second electrode 102 are provided on the substrate 400. Although it is favorable for the method for forming the insulating layer 401 to include PVD (Physical Vapor Deposition) such as vapor deposition, sputtering, etc., which have high film formation rates, CVD (Chemical Vapor Deposition) or ALD (Atomic Layer Deposition) may be used. $SiO_2$, SiN, $Al_2O_3$, etc., are examples of the insulating material.

Then, as shown in FIG. 4B, multiple openings OP1 that extend in the Y-axis direction are made in the insulating layer 401. At this time, for example, the insulating layer 401 is etched until the surface of the substrate 400 is exposed by RIE (Reactive Ion Etching) using a not-shown resist mask having a line-and-space pattern in the Y-axis direction. By this process, an insulating layer 401a that has the multiple openings OP1 extending in the Y-axis direction is formed.

At this time, the line-and-space pattern position is adjusted so that the first electrode 101 and the second electrode 102 provided on the substrate are exposed.

The insulating layer 401 may be formed by alternately stacking two or more films having mutually-different anisotropies for the etching rate. Thereby, after the RIE is performed, the Insulating layer 401a can have a structure in which pinched-in portions are provided periodically in the Z-axis direction.

Then, as shown in FIG. 4C, a magnetic film 402 is formed by CVD or ALD on the insulating layer 401a and on the substrate 400. The magnetic film 402 is formed so that the openings OP1 of the insulating layer 401a remain.

The magnetic film 402 is formed to be a perpendicular magnetization film. In other words, the magnetic film 402 that is formed on the side wall of the opening OP1 has an easy magnetization axis in the X-axis direction which is a direction perpendicular to the side wall. In the CVD or the ALD, a precursor that includes one or more elements Included in the material used to form the perpendicular magnetization film is used. Multiple precursors are used in the case where an alloy film is formed. A foundation layer may be formed on the insulating layer 401a and on the substrate 400 by CVD or ALD prior to the formation of the magnetic film 402 to perform the formation of the magnetic film 402 uniformly on the entire substrate surface or to adjust the adhesion and/or magnetic properties of the magnetic film 402. It is favorable to use a material such as W, TaN, etc., having a surface energy higher than that of the magnetic material as the adhesion layer. Pt, Pd, Ru, etc., are examples of the material of the foundation layer for adjusting the magnetic properties of the magnetic film 402. A capping layer for protecting the magnetic film 402 may be formed after the formation of the magnetic film 402. Pt, Ta, etc., are examples of the material of the capping layer.

Then, as shown in FIG. 4D, an Insulating layer 403 (a second insulating layer) is formed by filling an insulating material into the openings OP1 of the insulating layer 401a on which the magnetic film 402 is formed. The insulating layer 403 is made of the insulating layer 401a and the insulating material filled into the openings OP1. At least a portion of the magnetic film 402 is buried in the Interior of the insulating layer 403. CVD, ALD, or PVD is used to fill the insulating material. The insulating material may be the same as the insulating layer 401 or may be a different material. In the case where excessive insulating material exists on the surface after the filling, the excessive insulating material may be removed and the surface may be flattened by a method such as CMP (Chemical-Mechanical Polishing), etc.

Continuing as shown in FIG. 4E, multiple magnetic units 402a that are separated from each other in the Y-axis direction are formed by making multiple openings OP2 extending in the X-axis direction in the insulating layer 403. At this time, for example, the insulating layer 403 is etched until the surface of the substrate 400 is exposed by RIE using a not-shown resist mask having a line-and-space pattern in the X-axis direction. By this process, an insulating layer 403a that has the multiple openings OP2 extending in the X-axis direction is formed.

Then, similarly to FIG. 4D, an insulating layer 404 (a third insulating layer) is formed by filling an insulating material into the openings OP2 of the insulating layer 403a as shown in FIG. 4F. The insulating layer 404 is made of the insulating layer 403a and the insulating material filled into the openings OP2. At this time, the multiple magnetic units 402a are buried in the insulating layer 404. CVD, ALD, or PVD may be used to fill the Insulating material. The insulating material may be the same as that of FIGS. 4A and 4D or may be a different material. In the case where excessive insulating material exists on the surface after the filling, the excessive insulating material may be removed and the surface may be flattened by a method such as CMP, etc.

The structure of the magnetic units 402a that are made is shown in FIG. 5A as being removed from the insulating material that is filled. As shown in FIG. 5A, the multiple magnetic units 402a are formed on the substrate 400. Specifically, the magnetic units that extend in the Z-axis direction on the side walls of the insulating units having the columnar configurations are formed; and the magnetic units that extend in the X-axis direction on the substrate 400 are formed. The insulating units having the columnar configurations shown in FIG. 5A correspond to the insulating layer 401 without the portions that are removed when making the openings OP1 and the openings OP2.

The magnetic film 402 may be removed from the upper portion of the insulating layer 401a and the bottoms of the openings OP1 by anisotropic RIE performed between the processes shown in FIG. 4C and FIG. 4D so that the magnetic film 402 that is formed on the side walls of the openings OP1 remains. In such a case, as shown in FIG. 5B, multiple magnetic units 402b that are separated from each other in the X-axis direction and the Y-axis direction are formed.

Continuing, a magnetic film, a nonmagnetic film, and a pinned film are formed in this order on the insulating layer 404. As long as the desired magnetic properties are obtained, any method such as CVD, ALD, vapor deposition, sputtering, etc., recited above may be used as the film formation method. For example, in the case where sputtering is used, a target that includes at least one element from the examples of the materials of each of the layers is used. For example, in the case where the formation of the magnetic layers is performed by sputtering, a target that includes a material that forms an in-plane magnetization film is used.

Subsequently, the magnetic film, the nonmagnetic film, and the pinned film are patterned to form a magnetic layer 405, the nonmagnetic layer 202, and the pinned layer 201 on the insulating layer 404. In the case where the multiple magnetic units 402b such as those shown in FIG. 5B are formed, the magnetic layer 405, the nonmagnetic layer 202, and the pinned layer 201 are formed on two magnetic units 402b of the multiple magnetic units 402b. The configuration at this time is shown in FIG. 5C. The magnetic layer 405 that is formed on the magnetic units 402b corresponds to the third magnetic unit 303. In FIG. 5C, only the pinned layer 201 positioned at the uppermost portion is shown.

Because the magnetic film, the nonmagnetic film, and the pinned film are patterned simultaneously, the surface areas of the magnetic layer 405, the nonmagnetic layer 202, and the pinned layer 201 are equal to each other in the X-Y plane.

In the case where the magnetic layer 405 is formed selectively on the two magnetic units 402b extending in the Z-axis direction, the two magnetic units 402b are selected from the magnetic units 402b adjacent to each other in the X-axis direction or the Y-axis direction. The selected two magnetic units 402b correspond respectively to the first magnetic unit 301 and the second magnetic unit 302.

As shown in FIG. 5C, in the case where the magnetic layer 405 is provided on the magnetic units 402b adjacent to each other in the X-axis direction, the magnetic layer 405 has a structure extending in the X-axis direction. In such a case, the magnetization direction of the magnetic layer 405 is oriented easily in the X-axis direction due to the effect of the shape magnetic anisotropy. Also, by setting the easy magnetization axis of the magnetic layer 405 to be in the X-axis direction, it is possible for the magnetization direction of the magnetic layer 405 to be oriented in the X-axis direction more easily due to the effect of the easy magnetization axis and the effect of the shape magnetic anisotropy. Thereby, in the magnetic memory element 1, it is easier for the magnetization direction of the third magnetic unit 303 to be oriented in the same direction as the magnetization directions of the first magnetic unit 301 and the second magnetic unit 302. In such a case, the magnetization direction of the third magnetic unit 303 is parallel or antiparallel to the direction in which the current flows.

Conversely, in the case where the magnetic layer 405 is provided on the magnetic units 402b adjacent to each other in the Y-axis direction, the magnetic layer 405 has a structure extending in the Y-axis direction. In such a case, the magnetization direction of the magnetic layer 405 is oriented easily in the Y-axis direction due to the effect of the shape magnetic anisotropy. Accordingly, even in the case where the easy magnetization axis of the magnetic layer 405 is set to be in the X-axis direction, there is a possibility that the magnetization direction of the magnetic layer 405 may undesirably be oriented in a direction that is different from the magnetization directions of the first magnetic unit 301 and the second magnetic unit 302. In such a case, the magnetization direction of the third magnetic unit 303 is different from the direction in which the current flows.

To realize stable bit operations, it is desirable for the magnetization direction of the magnetic layer 405 to be the same as the magnetization direction of the first magnetic unit 301 and the magnetization direction of the second magnetic unit 302 and parallel or antiparallel to the direction in which the current flows. To this end, it is desirable for the magnetic layer 405 to be formed to extend in the same direction as the easy magnetization axis. Accordingly, it is desirable for the magnetic layer 405 to be formed on the two magnetic units 402a adjacent to each other in the easy magnetization axis direction of the magnetic layer 405.

Finally, as shown in FIG. 5D, the third electrode 103 is formed on the read/write unit 203 including the nonmagnetic layer 202 and the pinned layer 201; and not-shown bit lines and word lines are formed.

Second Embodiment

A magnetic memory element 2 according to a second embodiment will now be described using FIG. 6.

Figure 6:
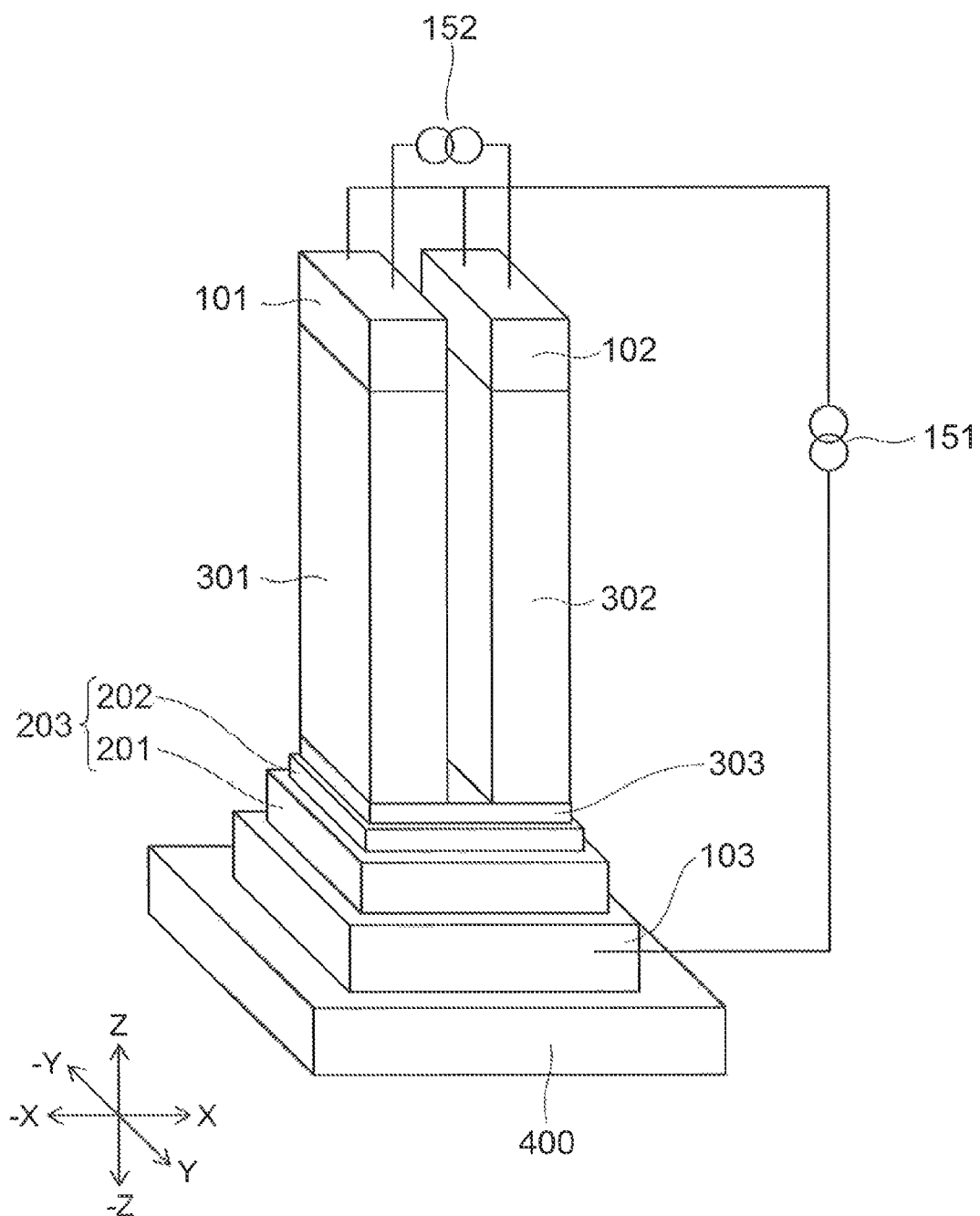
FIG. 6 is a perspective view of the magnetic memory element according to the second embodiment.

FIG. 6 is a perspective view of the magnetic memory element 2 according to the second embodiment.

Compared to the first embodiment, the order of the components in the Z-axis direction is reversed in the second embodiment. In other words, in the magnetic memory element 1, the first electrode 101 and the second electrode 102 are provided on the substrate 400; but in the magnetic memory element 2, the third electrode 103 is provided on the substrate 400. In the magnetic memory element 1, the surface area of the third magnetic unit 303 is equal to the surface area of the read/write unit 203 in the X-Y plane. Conversely, in the magnetic memory element 2, the surface area of the third magnetic unit 303 is less than the surface area of the read/write unit 203 in the X-Y plane. The stacked structure of the third magnetic unit 303 and the read/write unit 203 has a tapered configuration. In the stacked structure of the third magnetic unit 303 and the read/write unit 203, the dimensions in the X-axis direction and the Y-axis direction of the layers are smaller from the third electrode 103 toward the third magnetic unit 303.

The surface area in the X-Y plane of the third magnetic unit 303 is less than the surface area in the X-Y plane of the read/write unit 203. Accordingly, the current density of the third magnetic unit 303 is higher than the current density of the read/write unit 203. Therefore, even in the case where the current value flowing in the read/write unit 203 is set to be lower than that of the magnetic memory element 1, the current density necessary for the read-out operation and the writing operation of the third magnetic unit 303 can be obtained.

The materials of the components and the shift operation, the read-out operation, and the writing operation of the magnetic memory element 2 are similar to those of the magnetic memory element 1 according to the first embodiment.

A method for manufacturing the magnetic memory element 2 according to the second embodiment will now be described using FIGS. 7A to 7F and FIGS. 8A to 8D.

FIGS. 7A to 7F and FIGS. 8A to 8D are cross-sectional views of processes, showing the manufacturing processes of the magnetic memory element 2 according to the second embodiment.

First, as shown in FIG. 7A, a metal film 103a, a pinned film 201a, a nonmagnetic film 202a, and a magnetic film 405a are formed on the substrate 400 in which the transistors and interconnects are provided. As long as the desired magnetic properties are obtained, the film formation method may include CVD, ALD, or PVD.

Then, as shown in FIG. 7B, the third electrode 103, the pinned layer 201, the nonmagnetic layer 202, and the magnetic layer 405 are formed collectively by RIE, ion milling, etc. At this time, the conditions of the RIE and/or the ion milling are adjusted to pattern the magnetic layer 405 and the read/write unit 203 to provide the magnetic layer 405 and the read/write unit 203 with a taper. Although only one set of the magnetic layer 405 and the read/write unit 203 are shown in FIG. 7B, multiple magnetic layers 405 and multiple read/write units 203 may be multiply arranged in the X-axis direction and the Y-axis direction on the substrate 400.

Continuing as shown in FIG. 7C, the insulating layer 401 (the first insulating layer) is formed on the substrate 400 on which the pinned layer 201, the nonmagnetic layer 202, and the magnetic layer 405 are formed.

Then, the multiple openings OP1 that extend in the Y-axis direction are made in the insulating layer 401 to expose the two ends in the X-axis direction of the magnetic layer 405. The configuration at this time is shown in FIG. 7D. For example, the patterning of the insulating layer 401 is performed by RIE using a not-shown resist mask having a line-and-space pattern in the Y-axis direction. By this process, the multiple openings OP1 that extend in the Y-axis direction are made in the insulating layer 401a.

In FIG. 7B, only one set of the third electrode 103, the pinned layer 201, the nonmagnetic layer 202, and the magnetic layer 405 is shown on the substrate 400. However, in the process of FIG. 7D and the subsequent processes, the processes that are performed on multiple sets of the third electrode 103, the pinned layer 201, the nonmagnetic layer 202, and the magnetic layer 405 are shown.

Then, as shown in FIG. 7E, the magnetic film 402 is formed by CVD or ALD on the substrate 400 and on the insulating layer 401a in which the openings OP1 are made. At this time, the magnetic film 402 is formed to contact the two ends in the X-axis direction of the magnetic layer 405.

Continuing as shown in FIG. 7F, magnetic units 402c that are mutually independent and extend in the Z-axis direction are formed by removing the magnetic layer on the substrate 400 and the magnetic layer of the insulating layer 401a upper portion by anisotropic RIE so that the magnetic layer formed on the side wall remains.

Then, as shown in FIG. 8A, the insulating layer 403 is formed by filling an insulating material. The excessive insulating material that is on the surface after the filling is removed and the surface is flattened by a method such as CMP, etc.

Continuing, multiple magnetic units 402d that are separated from each other in the X-axis direction and the Y-axis direction are formed by making the multiple openings OP2 extending in the X-axis direction in the insulating layer 403 so that the insulating layer 403 remains on the magnetic layer 405. The configuration at this time is shown in FIG. 8B. For example, the insulating layer 403 is etched until the surface of the substrate 400 is exposed by RIE using a not-shown resist mask having a line-and-space pattern in the X-axis direction. By this process, the insulating layer 403a that has the multiple openings OP2 extending in the X-axis direction is formed.

Then, as shown in FIG. 8C, the insulating layer 404 is formed by filling an insulating material. The excessive insulating material that is on the surface after the filling is removed and the surface is flattened by a method such as CMP, etc.

Finally, as shown in FIG. 8D, the first electrode 101 and the second electrode 102 are formed on the magnetic unit 402b. Subsequently, not-shown bit lines and word lines are formed. The film formation, etching, etc., of the components may include methods similar to the method for making the magnetic memory element 1.

Third Embodiment

A magnetic memory element 3 according to a third embodiment will now be described using FIG. 9.

Figure 9:
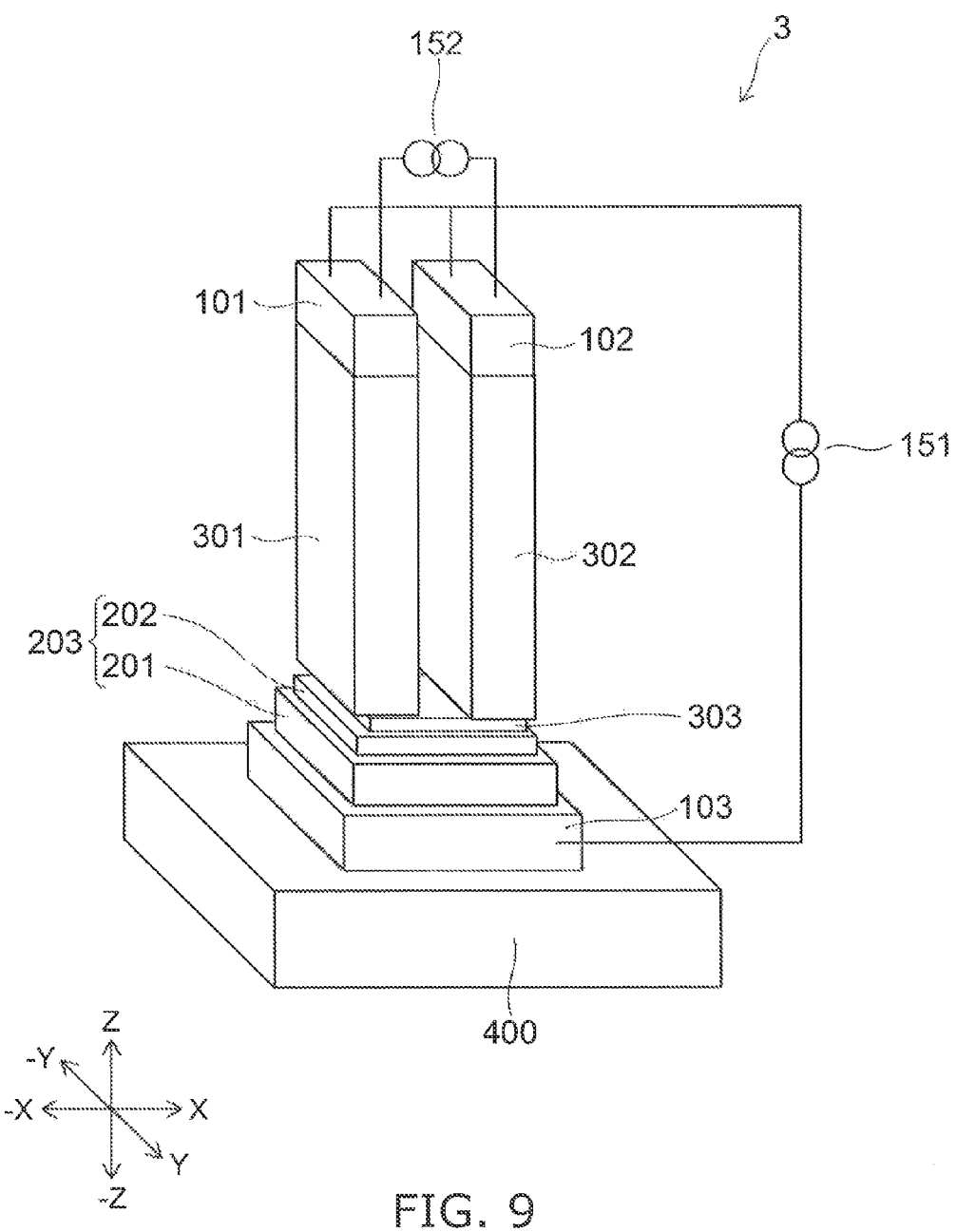
FIG. 9 is a perspective view of the magnetic memory element according to the third embodiment.

FIG. 9 is a perspective view of the magnetic memory element 3 according to the third embodiment.

Compared to the second embodiment, the connection surface area between the third magnetic unit 303 and the second magnetic unit 302 and the connection surface area between the third magnetic unit 303 and the first magnetic unit 301 are small in the third embodiment.

The materials of the components and the shift operation, the read-out operation, and the writing operation, of the magnetic memory element 3 are similar to those of the magnetic memory element 1 according to the first embodiment.

In the embodiment, the cross-sectional area in the X-Y plane of the second magnetic unit 302 is greater than the contact surface area between the third magnetic unit 303 and the second magnetic unit 302. The cross-sectional area in the X-Y plane of the first magnetic unit 301 is greater than the contact surface area between the third magnetic unit 303 and the first magnetic unit 301. Therefore, the current density is large at the connection portion between the third magnetic unit 303 and the second magnetic unit 302 and at the connection portion between the third magnetic unit 303 and the first magnetic unit 301. Accordingly, compared to the second embodiment, the shift errors do not occur easily because the domain walls can be moved easily in these connection portions which are bent.

A method similar to the method for making the magnetic memory element 2 according to the second embodiment may be used as the method for making the magnetic memory element 3. Specifically, in the method for making the magnetic memory element 2, patterning is performed so that the surface area in the X-Y plane of the magnetic layer 405 decreases when making the magnetic layer 405 by patterning the magnetic film 405a. Also, the formation of the magnetic film 402 and the patterning of the insulating layer 403 are performed so that the Z-axis direction end surfaces of the first magnetic unit 301 and the second magnetic unit 302 partially contact the magnetic layer 405.

To provide the magnetic units at a high density when making the magnetic memory element 3, it is favorable for the opening positions of the insulating layer to be adjusted so that the first magnetic unit 301 and the second magnetic unit 302 are within the surface area of the pinned layer 201 as viewed from the Z-axis direction. In other words, when viewed from the direction in which the first magnetic unit 301 and the second magnetic unit 302 extend, it is favorable for the first magnetic unit 301 and the second magnetic unit 302 to be positioned inside the outer edge of the pinned layer 201 to overlap the pinned layer 201.

Fourth Embodiment

A magnetic memory element 4 according to a fourth embodiment will now be described using FIGS. 10A and 10B.

FIGS. 10A and 10B are perspective views of the magnetic memory element 4 according to the fourth embodiment.

FIG. 10A is a perspective view of the magnetic memory element 4 as viewed from one direction; and FIG. 10B is a perspective view of the magnetic memory element 4 as viewed from another direction.

Compared to the first embodiment, the number of magnetic units connected to the third magnetic unit 303 is different in the fourth embodiment. In the first embodiment, two magnetic units that extend in the Z-axis direction are connected to one third magnetic unit 303. Conversely, in the embodiment, four magnetic units that extend in the Z-axis direction are connected to one third magnetic unit 303.

Compared to the magnetic memory element 1, the magnetic memory element 4 further includes a fourth magnetic unit 304, a fifth magnetic unit 305, a fourth electrode 104, and a fifth electrode 105.

The fourth magnetic unit 304 and the fifth magnetic unit 305 extend in the Z-axis direction. One Z-axis direction end of the fourth magnetic unit 304 is connected to the third magnetic unit 303. The other Z-axis direction end of the fourth magnetic unit 304 is connected to the fourth electrode 104. One Z-axis direction end of the fifth magnetic unit 305 is connected to the third magnetic unit 303. The other Z-axis direction end of the fifth magnetic unit 305 is connected to the fifth electrode 105.

The materials of the fourth magnetic unit 304 and the fifth magnetic unit 305 may be materials similar to those of the first magnetic unit 301 and the second magnetic unit 302. The materials of the fourth electrode 104 and the fifth electrode 105 may be materials similar to those of the first electrode 101 and the second electrode 102.

The other materials of the components, etc., are similar to those of the first embodiment.

The first current source 151 is connected to the first to fifth electrodes 101 to 105.

The second current source 152 is connected to the first electrode 101, the second electrode 102, the fourth electrode 104, and the fifth electrode 105.

In the read-out operation and in the writing operation, the first current source 151 causes a current to flow between the third electrode 103 and the first electrode 101, the second electrode 102, the fourth electrode 104, and the fifth electrode 105. Accordingly, compared to the case where only one magnetic unit is connected to the third magnetic unit 303, in the read-out operation and in the writing operation, ¼ of the current can flow in each of the magnetic units. Therefore, the occurrence of errors in which the domain walls of each of the magnetic units shift due to the current flowing through each of the magnetic units when performing the reading or the writing of the information from or to the third magnetic unit 303 can be suppressed drastically.

Also, for example, the same information can be stored in the first magnetic unit 301 and the fourth magnetic unit 304; and the same information can be stored in the second magnetic unit 302 and the fifth magnetic unit 305. Thus, by storing the same information in multiple magnetic units, even in the case where an error occurs in one magnetic unit when shifting the domain walls, correcting can be performed using the information of the other magnetic unit. Therefore, it is possible to improve the resistance to errors.

A method for making the magnetic memory element 4 will now be described.

First, processes similar to the processes of FIGS. 4A to 4F and FIGS. 5A to 5B are performed; and multiple magnetic units that extend in the Z-axis direction are formed.

Then, a magnetic film, a nonmagnetic film, a pinned film, and a metal film are formed on the insulating layer 404.

Continuing, the magnetic layer 405, the nonmagnetic layer 202, the pinned layer 201, and the third electrode 103 are formed by RIE, ion milling, etc., and by patterning each film to connect four magnetic units of the multiple magnetic units.

The magnetic memory element 4 according to the fourth embodiment is obtained by the processes described above.

The shift operation of the magnetic memory element 4 will now be described.

In the magnetic memory element 4, the third magnetic unit 303 has a single magnetic domain structure in the state in which the shift of the domain walls is not being performed. Accordingly, it is favorable for the magnetic bit of the third magnetic unit 303 to be shifted simultaneously into the multiple magnetic units to stably perform the shift operation of the domain walls. In the shift operation of the magnetic bits, for example, the first current source 151 causes a current to flow from the first electrode 101 and the fourth electrode 104 toward the second electrode 102 and the fifth electrode 105. At this time, the magnetic bit that is written to the third magnetic unit 303 is shifted into both the second magnetic unit 302 and the fifth magnetic unit 305.

When reading the magnetic bits of each of the magnetic units, it is favorable for magnetic bits having the same magnetization direction to be shifted simultaneously into the third magnetic unit 303 from the multiple magnetic units.

In the magnetic memory element 4, when performing the read-out operation or the writing operation as described above, the reading or the writing of the magnetic bit from or to the third magnetic unit 303 is performed by the first current source causing a current to flow between the third electrode 103 and the first electrode 101, the second electrode 102, the fourth electrode 104, and the fifth electrode 105. The magnetization direction of the third magnetic unit 303 being controlled by the relationship between the direction in which the current flows and the magnetization direction of the pinned layer 201 is similar to the first embodiment.

Although four magnetic units are connected to one third magnetic unit 303 in the example shown in FIGS. 10A and 10B, three, five, or more magnetic units may be connected to one third magnetic unit 303. In the case where N magnetic units (N being an integer not less than 3) are connected to one third magnetic unit 303, compared to the case of one magnetic unit, the current that flows through each of the magnetic units in the read-out operation and in the writing operation can be reduced to 1/N of the current.

Fifth Embodiment

A magnetic memory element 5 according to a fifth embodiment will now be described using FIG. 11.

Figure 11:
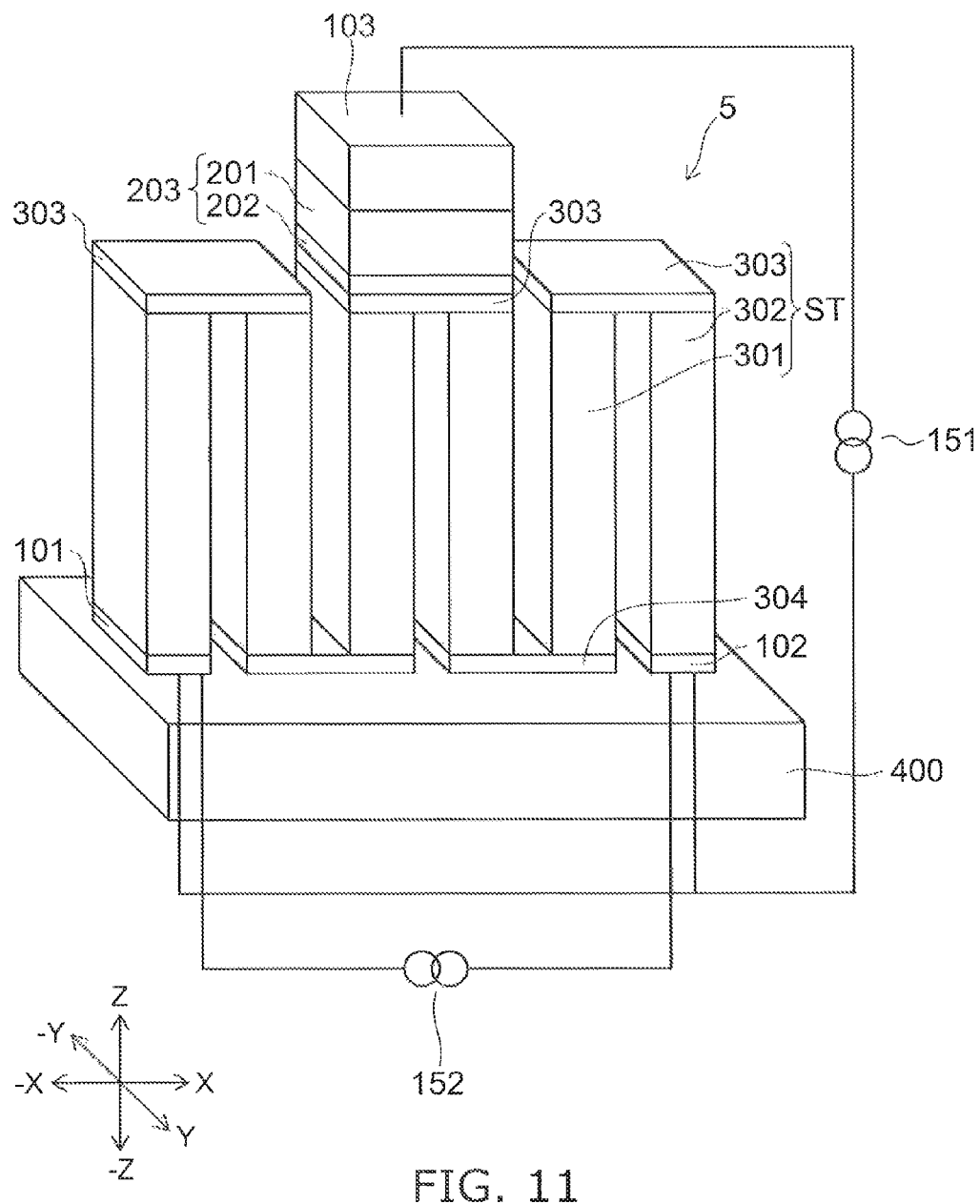
FIG. 11 is a perspective view of the magnetic memory element according to the fifth embodiment.

FIG. 11 is a perspective view of the magnetic memory element 5 according to the fifth embodiment.

The fifth embodiment differs from the first embodiment in that the magnetic units are continuously connected to multiple other magnetic units adjacent in the X-axis direction.

The magnetic memory element 5 includes a structural body ST including the third magnetic unit 303, and the first magnetic unit 301 and the second magnetic unit 302 that are connected to the third magnetic unit 303. The magnetic memory element 5 includes a structural body array in which the structural bodies ST are multiply arranged in a direction intersecting the Z-axis direction. The magnetic memory element 5 includes the fourth magnetic unit 304 that connects the first magnetic unit 301 included in the structural body ST and the second magnetic unit 302 included in the structural body ST adjacent to the first magnetic unit 301. The first magnetic unit 301 of the multiple first magnetic units 301 that is not connected to the fourth magnetic unit 304 is connected to the first electrode 101. The second magnetic unit 302 of the multiple second magnetic units 302 that is not connected to the fourth magnetic unit 304 is connected to the second electrode 102.

In the embodiment, it is possible to increase the capacity in not only the Z-axis direction but also in the X-axis direction.

It is favorable for the structural bodies ST to be arranged in the easy magnetization axis directions of the first magnetic unit 301, the second magnetic unit 302, and the third magnetic unit. In such a case, the fourth magnetic units 304 that connect the structural bodies ST to each other also have structures that extend in the easy magnetization axis directions of the other magnetic units. Therefore, due to the shape magnetic anisotropy, it is easy to cause the magnetization direction of the fourth magnetic unit 304 to be the same direction as the magnetization directions of the other magnetic units.

A method for making the magnetic memory element 5 will now be described.

First, processes that are similar to the processes of FIGS. 4A to 4F and FIG. 5A are performed to form the multiple magnetic units that extend in the Z-axis direction and the magnetic units that extend in the X-axis direction to connect the multiple magnetic units extending in the Z-axis direction.

In the manufacturing processes of the magnetic memory element according to the first embodiment, thereafter, the magnetic units that are deposited on the substrate 400 and extend in the X-axis direction are removed. However, in the embodiment, the following processes are performed without removing the magnetic units extending in the X-axis direction.

Similarly to FIGS. 5C and 5D, the third magnetic unit 303, the nonmagnetic layer 202, the pinned layer 201, and the third electrode 103 that connect two magnetic units of the multiple magnetic units are formed. In such a case, it is sufficient for one read/write unit 203 to be formed on one of the third magnetic units 303 of one set of magnetic units connected continuously. Or, the read/write unit 203 may be formed on each of the multiple third magnetic units 303 of one set of magnetic units connected continuously.

When shifting the domain walls included in each of the magnetic units, the second current source 152 causes a current to flow between the first electrode 101 and the second electrode 102.

When performing the read-out operation or the writing operation, the reading or the writing of the magnetic bit from or to the third magnetic unit 303 is performed by the first current source 151 causing a current to flow between the third electrode 103 and at least one of the first electrode 101 or the second electrode 102. The magnetization direction of the third magnetic unit 303 being controlled by the relationship between the direction in which the current flows and the magnetization direction of the pinned layer 201 is similar to the first embodiment.

The materials of the components, etc., are similar to those of the first embodiment. Materials similar to those of the first magnetic unit 301 and the second magnetic unit 302 may be used as the materials of the fourth magnetic unit.

A modification of the magnetic memory element according to the fifth embodiment will now be described using FIG. 12.

Figure 12:
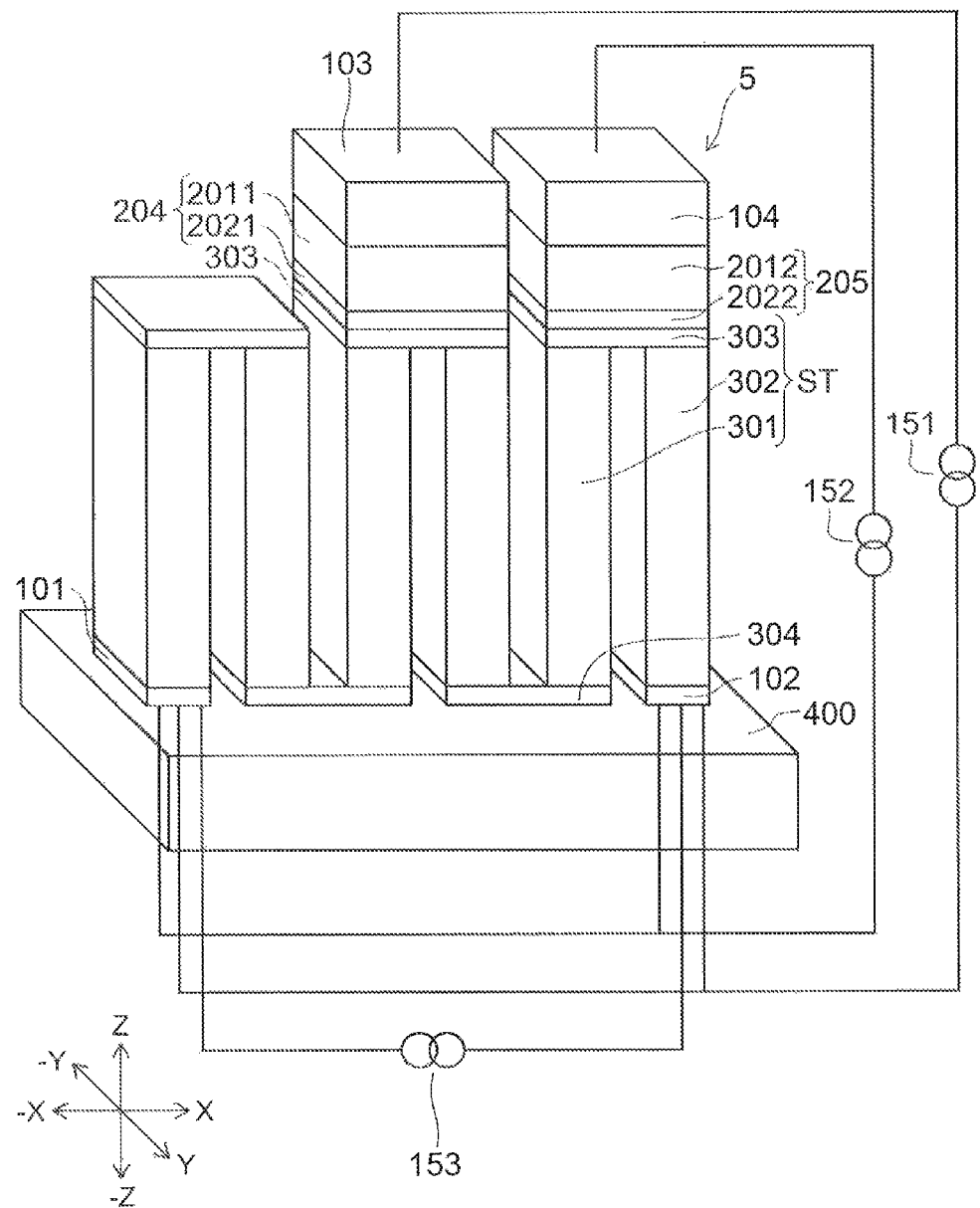
FIG. 12 is a perspective view showing the modification of the magnetic memory element according to the fifth embodiment.

FIG. 12 is a perspective view showing the modification of the magnetic memory element 5 according to the fifth embodiment.

In the modification shown in FIG. 12, a read-out unit 204 that includes a pinned layer 2011 and a nonmagnetic layer 2021 is provided on one third magnetic unit 303 of one set of magnetic units connected continuously. A write unit 205 that includes a pinned layer 2012 and a nonmagnetic layer 2022 is provided on another third magnetic unit 303. The read-out unit 204 and the write unit 205 may be multiply provided for the one set of magnetic units connected continuously.

The third electrode 103 is connected to the read-out unit 204; and the fourth electrode 104 is connected to the write unit 205.

When shifting the domain walls included in each of the magnetic units, a third current source 153 causes a current to flow between the first electrode 101 and the second electrode 102.

When performing the read-out operation, the reading of the magnetic bit of the third magnetic unit 303 contacting the read-out unit 204 is performed by the first current source 151 causing a current to flow between the third electrode 103 and at least one of the second electrode 102 or the first electrode 101.

When performing the writing operation, the writing of the magnetic bit of the third magnetic unit 303 contacting the write unit 205 is performed by the second current source 152 causing a current to flow between the third electrode 103 and at least one of the first electrode 101 or the second electrode 102.

The principle of the read-out operation and the writing operation is similar to that of the other embodiments.

As shown in FIG. 12, the current source that is connected to the third electrode 103 and the current source that is connected to the fourth electrode 104 may be provided separately. Or, a common current source that is connected to both the third electrode 103 and the fourth electrode 104 may be provided. In other words, the first current source 151 and the second current source 152 may be one common current source.

Sixth Embodiment

A magnetic memory element 6 according to a sixth embodiment will now be described using FIG. 13.

Figure 13:
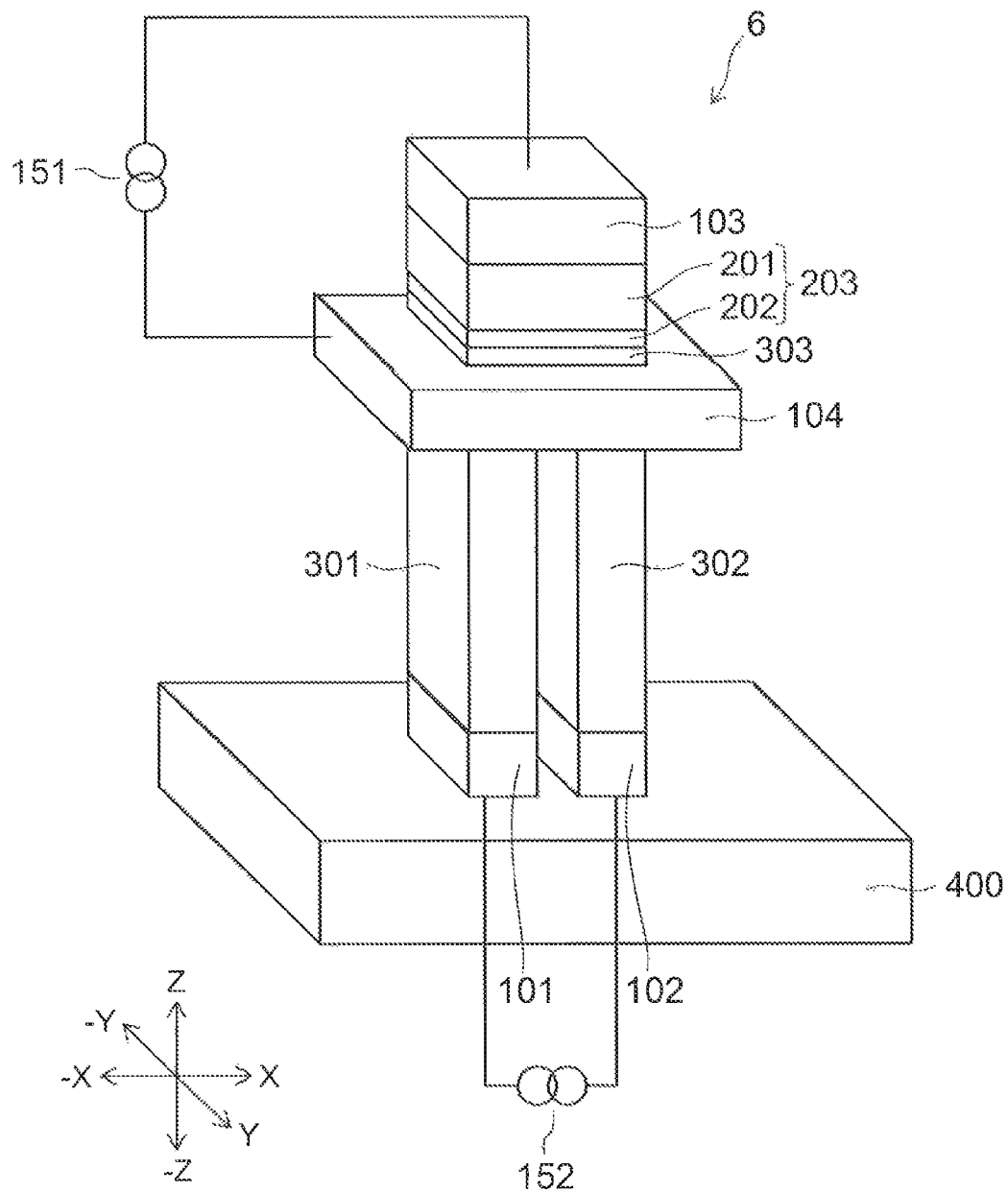
FIG. 13 is a perspective view of the magnetic memory element according to the sixth embodiment.

FIG. 13 is a perspective view of the magnetic memory element 6 according to the sixth embodiment.

The sixth embodiment differs from the first embodiment in that the sixth embodiment further includes the fourth electrode 104. The fourth electrode 104 is connected to the third magnetic unit 303. The fourth electrode 104 is used in the read-out operation and the writing operation.

In the embodiment, the third electrode 103 and the fourth electrode 104 are connected to the first current source 151. The first electrode 101 and the second electrode 102 are connected to the second current source 152.

The fourth electrode 104 may include, for example, a material similar to that of the third electrode 103. Otherwise, the materials of the components are similar to those of the magnetic memory element 1 according to the first embodiment.

The fourth electrode 104 is provided around the third magnetic unit 303. In the case where the third magnetic unit 303 has a single magnetic domain structure, the fourth electrode 104 may be provided around the vicinity of the connection portion of the first magnetic unit 301 for the first magnetic unit 301 and the third magnetic unit 303 and the vicinity of the connection portion of the second magnetic unit 302 for the second magnetic unit 302 and the third magnetic unit 303 to contact both connection portion vicinities. In such a case, the fourth electrode 104 is connected to the third magnetic unit 303 via the connection portion vicinities. Or, the fourth electrode 104 may be provided around both the third magnetic unit 303 and the connection portion vicinities.

Or, the fourth electrode 104 may be provided in contact with one of the third magnetic unit 303, the vicinity of the connection portion of the first magnetic unit 301 for the first magnetic unit 301 and the third magnetic unit 303, or the vicinity of the connection portion of the second magnetic unit 302 for the second magnetic unit 302 and the third magnetic unit 303 in a region not between the first magnetic unit 301 and the second magnetic unit 302. Or, the fourth electrode 104 may be provided in contact with the third magnetic unit 303 in a region not between the first magnetic unit 301 and the second magnetic unit 302.

The fourth electrode 104 is provided at a position not in direct contact with the read/write unit 203 so that the currents in the read-out operation and in the writing operation flow through the third magnetic unit 303.

A method for making the magnetic memory element 6 will now be described.

First, processes similar to those of the processes of FIGS. 4A to 4C are performed.

Subsequently, when filling the space that extends in the Y-axis direction, the uppermost portion of the space is filled with an electrode material.

Continuing, a process similar to that of FIG. 4E is performed; and the uppermost portion of the space is filled with an electrode material when filling the space that extends in the X-axis direction.

Subsequently, for example, in the process of FIG. 5D, the electrode material of the uppermost portion that is used in the filling is formed into the pattern of the fourth electrode 104 when forming the third magnetic unit 303, the read/write unit 203, and the third electrode 103 by patterning the magnetic films, etc.

The read-out operation and the writing operation of the magnetic memory element 6 will now be described.

When writing a magnetic bit having the same direction as the magnetization direction of the pinned layer 201 to the third magnetic unit 303, the first current source 151 causes the current to flow into the third electrode 103 from the fourth electrode 104. Because the electrons flow in a reverse orientation to the current, in this case, the electrons flow from the third electrode 103 into the fourth electrode 104.

The electrons are spin-polarized when passing through the pinned layer 201. The spin-polarized electrons flow through the nonmagnetic layer 202 into the region of the third magnetic unit 303 where the writing is to be performed. Then, the spin-polarized electrons that have a spin in the same direction as that of the region where the writing is to be performed pass through the region where the writing is to be performed. However, the spin-polarized electrons that have a spin in a direction that is different from the magnetization direction of the region where the writing is to be performed apply a spin torque to the magnetization of the region where the writing is to be performed. The spin torque that is applied to the magnetization of the region where the writing is to be performed acts to cause the magnetization direction of the region where the writing is to be performed to be oriented in the same direction as the magnetization direction of the pinned layer 201. Thereby, the magnetization of the region where the writing is to be performed is controlled to be in the same direction as the magnetization of the pinned layer 201.

When writing a magnetic bit having a direction that is different from the magnetization direction of the pinned layer 201 to the third magnetic unit 303, the current is caused to flow in the reverse direction of that of the case where the same direction as the magnetization direction of the pinned layer 201 is written to the magnetic bit of the third magnetic unit 303. In other words, the electrons flow from the fourth electrode 104 toward the third electrode 103.

When the electrons pass through the pinned layer 201, the electrons that have a spin in the same direction as the magnetization of the pinned layer 201 pass through the pinned layer 201; but the electrons that have a spin in a direction different from the magnetization of the pinned layer 201 are reflected by the interface between the nonmagnetic layer 202 and the pinned layer 201 and flow into the region of the third magnetic unit 303 where the writing is to be performed. Then, the spin-polarized electrons having the spin in the direction that is different from the magnetization of the pinned layer 201 apply a spin torque to the magnetization of the region of the third magnetic unit 303 where the writing is to be performed. The spin torque that is applied to the magnetization of the region where the writing is to be performed acts to cause the magnetization direction of the region where the writing is to be performed to be oriented in the direction that is different from the magnetization direction of the pinned layer 201. Thereby, the magnetization of the region where the writing is to be performed is controlled to be the direction that is different from the magnetization of the pinned layer 201.

When reading, a constant current is caused to flow or a constant electrical potential is applied between the fourth electrode 104 and the third electrode 103. At this time, the electrical resistance between the fourth electrode 104 and the third electrode 103 changes due to the angle between the magnetization direction of the pinned layer 201 and the magnetization direction of the region where the reading is to be performed inside the third magnetic unit 303. Specifically, the resistance value recited above is a low value when the magnetization direction of the pinned layer 201 and the magnetization direction of the region where the reading is to be performed are the same; and the resistance value recited above is a high value when the magnetization direction of the pinned layer 201 and the magnetization direction of the region where the reading is to be performed are opposite. The reading of the information is performed by sensing the magnetization direction of the region where the reading is to be performed by sensing the resistance value when the current is caused to flow between the pinned layer 201 and the third magnetic unit 303.

The currents in the read-out operation and in the writing operation flow between the third electrode 103 and the fourth electrode 104 as described above. Therefore, the current that flows in the first magnetic unit 301 flows only in the vicinity of the connection portion of the first magnetic unit 301 for the first magnetic unit 301 and the third magnetic unit 303. For the second magnetic unit 302 as well, the current flows only in the vicinity of the connection portion of the second magnetic unit 302 for the second magnetic unit 302 and the third magnetic unit 303. Accordingly, the errors in which the domain walls of the second magnetic unit 302 and the third magnetic unit 303 erroneously shift due to the currents in the read-out operation and in the writing operation can be reduced.

It is possible to provide the first magnetic unit 301 and the second magnetic unit 302 to be proximal to each other because the fourth electrode 104 is provided at a position other than the region between the first magnetic unit 301 and the second magnetic unit 302. Therefore, it is possible to provide the magnetic units at a high density.

Because the fourth electrode 104 is provided at the outer circumferential portion of the third magnetic unit 303, the currents in the read-out operation and in the writing operation flow uniformly through the third magnetic unit 303; and the input/output in the read-out operation and in the writing operation can be performed stably.

Similarly to the first embodiment, the memory shift operation is performed by the second current source 152 causing the current to flow between the first electrode 101 and the second electrode 102. As in the second embodiment, the order of the components of the magnetic memory element 6 may be the opposite of that of the magnetic memory element 6 shown in FIG. 13 in the Z-axis direction.

Seventh Embodiment

A magnetic memory 7 according to a seventh embodiment will now be described using FIG. 14.

Figure 14:
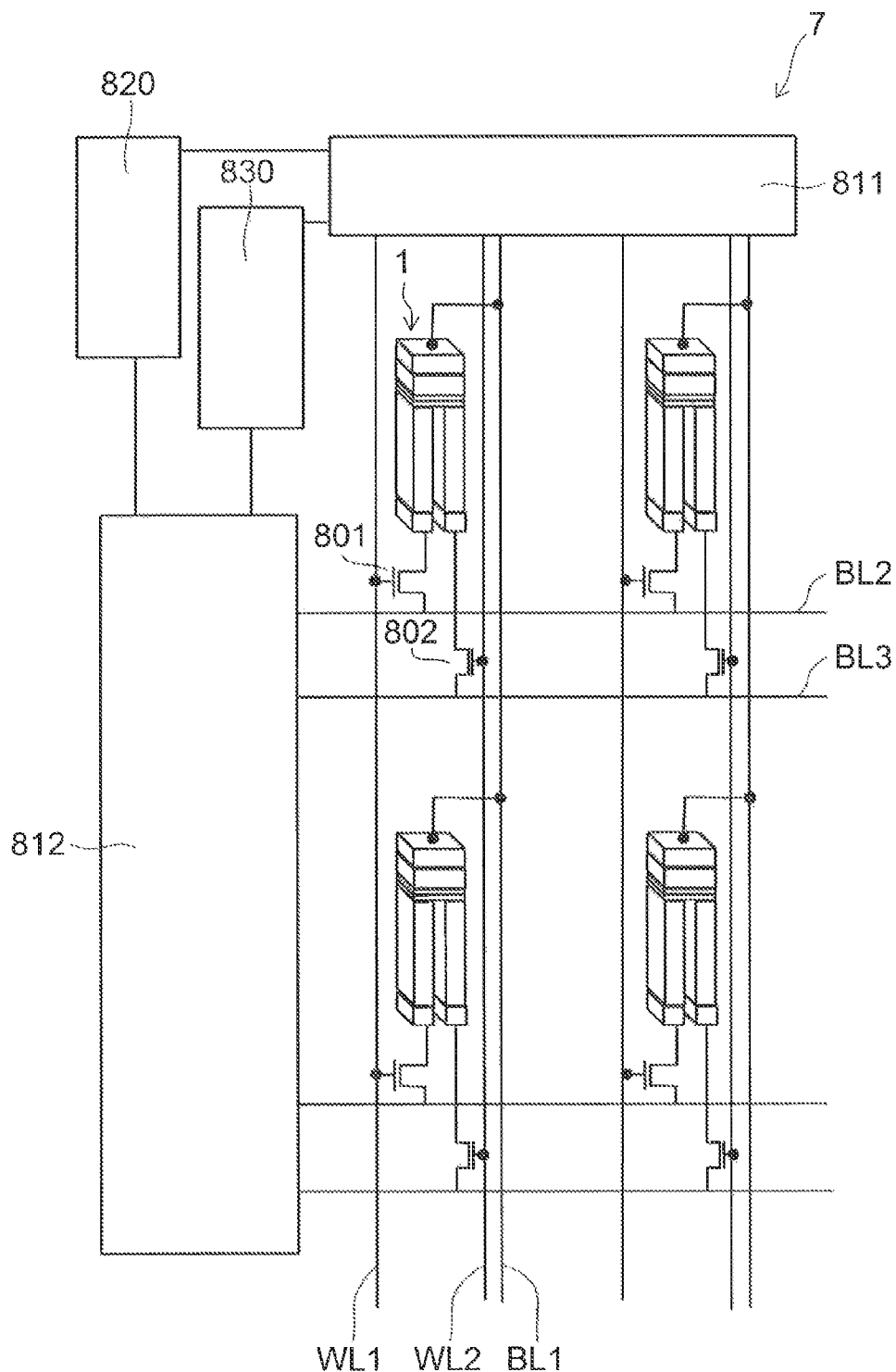
FIG. 14 is a schematic view of the magnetic memory according to the seventh embodiment.

FIG. 14 is a schematic view of the magnetic memory 7 according to the seventh embodiment.

The magnetic memory 7 is, for example, a shift register memory in which the magnetic memory elements 1 according to the first embodiment are multiply provided.

The magnetic memory 7 includes the magnetic memory elements 1, a first transistor 801, a second transistor 802, a first selector 811, a second selector 812, a current source circuit 820, and a resistance value sensor 830.

The first selector 811 is connected to a first bit line BL1, a first word line WL1, and a second word line WL2. The second selector 812 is connected to a second bit line BL2 and a third bit line BL3.

The third electrode 103 is connected to the first bit line BL1.

The gate of the first transistor 801 is connected to the first word line WL1. One terminal other than the gate of the first transistor 801 is connected to the first electrode 101; and the other terminal is connected to the second bit line BL2.

The gate of the second transistor 802 is connected to the second word line WL2. One terminal other than the gate of the second transistor 802 is connected to the second electrode 102; and the other terminal is connected to the third bit line BL3.

The current source circuit 820 that functions as the first current source 151 and the second current source 152 is connected to the first selector 811 and the second selector 812.

The resistance value sensor 830 is connected to the first selector 811 and the second selector 812. The resistance value sensor 830 is capable of sensing the change of the resistance value between the first bit line BL1 connected to the third electrode 103 and the second bit line BL2 connected to the first electrode 101 and the third bit line BL3 connected to the second electrode 102.

For example, it is possible to sense the change of the resistance value by the current source circuit 820 causing a constant current to flow between the third electrode 103 and the first electrode 101 and the second electrode 102 and by the resistance value sensor 830 sensing the change of the voltage between the third electrode 103 and the first electrode 101 and the second electrode 102. Or, it is possible to sense the change of the resistance value by the current source circuit 820 applying a constant electrical potential between the third electrode 103 and the first electrode 101 and the second electrode 102 and by the resistance value sensor 830 sensing the change of the current flowing between the third electrode 103 and the first electrode 101 and the second electrode 102.

It is possible to further increase the magnetic recording density of the magnetic memory by using the magnetic memory element 1 in the magnetic memory.

Although an example is illustrated in the embodiment in which the magnetic memory 7 multiply includes the magnetic memory elements 1, the magnetic memory 7 may multiply include other magnetic memory elements according to the embodiments instead of the magnetic memory element 1 according to the first embodiment.

Eighth Embodiment

A magnetic memory 8 according to an eighth embodiment will now be described using FIG. 15.

Figure 15:
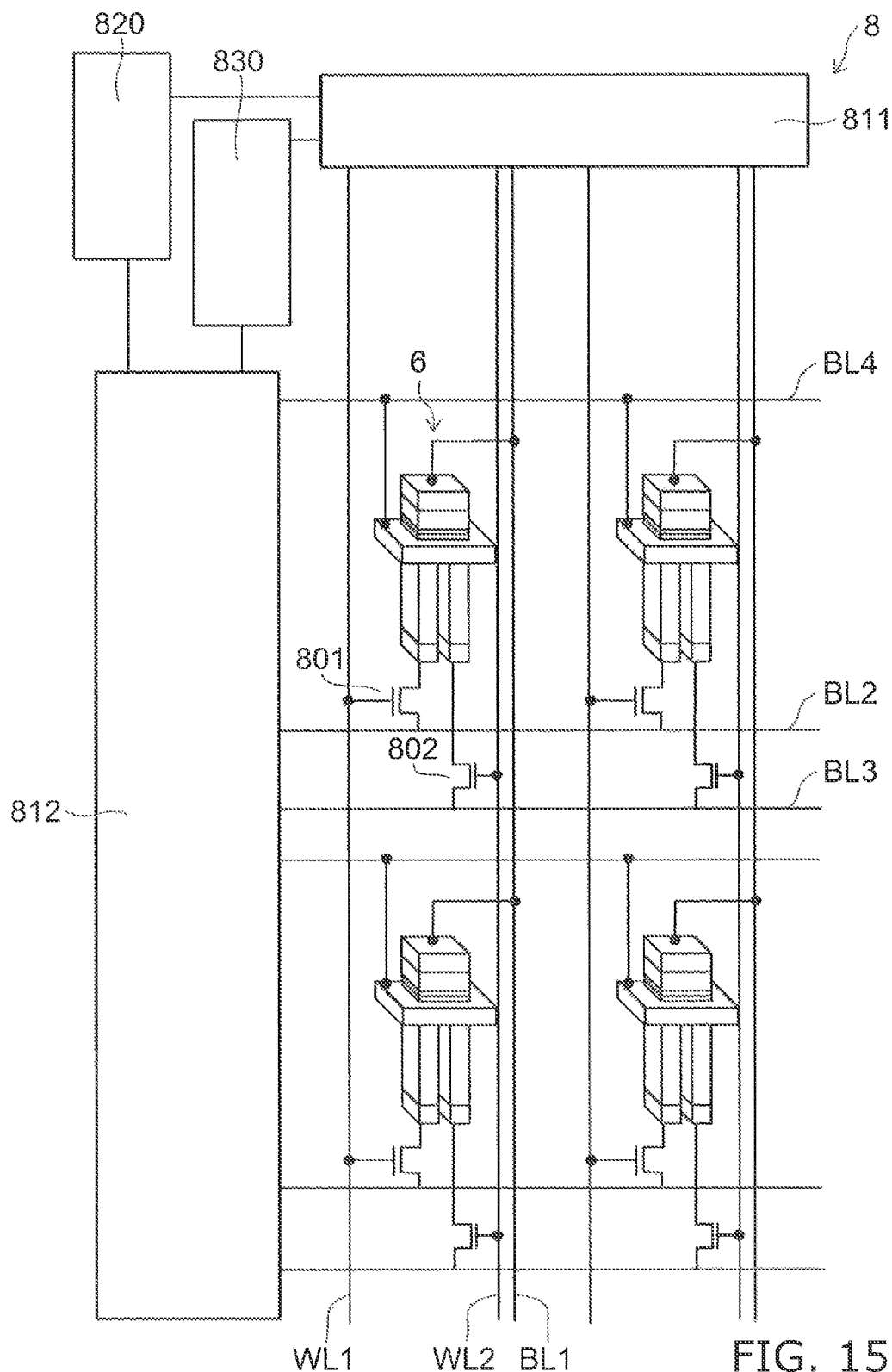
FIG. 15 is a schematic view of the magnetic memory according to the eighth embodiment.

FIG. 15 is a schematic view of the magnetic memory 8 according to the eighth embodiment.

The magnetic memory 8 is, for example, a shift register memory in which the magnetic memory elements 6 according to the sixth embodiment are multiply provided.

The magnetic memory 8 includes the magnetic memory element 6, the first transistor 801, the second transistor 802, the first selector 811, the second selector 812, the current source circuit 820, and the resistance value sensor 830.

The first selector 811 is connected to the first bit line BL1, the first word line WL1, and the second word line WL2. The second selector 812 is connected to the second bit line BL2, the third bit line BL3, and a fourth bit line BL4.

The third electrode 103 is connected to the first bit line BL1.

The fourth electrode 104 is connected to the fourth bit line BL4.

The gate of the first transistor 801 is connected to the first word line WL1. One terminal other than the gate of the first transistor 801 is connected to the first electrode 101; and the other terminal is connected to the second bit line BL2.

The gate of the second transistor 802 is connected to the second word line WL2. One terminal other than the gate of the second transistor 802 is connected to the second electrode 102; and the other terminal is connected to the third bit line BL3.

The current source circuit 820 that functions as the first current source 151 and the second current source 152 is connected to the first selector 811 and the second selector 812.

The resistance value sensor 830 is connected to the first selector 811 and the second selector 812. The resistance value sensor 830 is capable of sensing the change of the resistance value between the first bit line BL1 connected to the third electrode 103 and the fourth bit line BL4 connected to the fourth electrode 104.

For example, it is possible to sense the change of the resistance value by the current source circuit 820 causing a constant current to flow between the third electrode 103 and the fourth electrode 104 and by the resistance value sensor 830 sensing the change of the voltage between the third electrode 103 and the fourth electrode 104. Or, it is possible to sense the change of the resistance value by the current source circuit 820 applying a constant electrical potential between the third electrode 103 and the fourth electrode 104 and by the resistance value sensor 830 sensing the change of the current flowing between the third electrode 103 and the fourth electrode 104.

It is possible to further increase the magnetic recording density of the magnetic memory by using the magnetic memory elements 6 in the magnetic memory.

In the specification of the application, the words "orthogonal," "perpendicular," and "parallel" include the fluctuation due to manufacturing processes. Accordingly, it is sufficient to be substantially orthogonal, perpendicular, or parallel.

Note 1

A method for operating a magnetic memory element, the magnetic memory element including:

a first magnetic unit extending in a first direction, having an easy magnetization axis in a direction intersecting the first direction, and being capable of retaining multiple magnetic domains in the first direction;

a second magnetic unit provided to be separated from the first magnetic unit, the second magnetic unit extending in the first direction, having an easy magnetization axis in a direction intersecting the first direction, and being capable of retaining multiple magnetic domains in the first direction;

a third magnetic unit extending in a second direction intersecting the first direction, the third magnetic unit being connected to one end in the first direction of the first magnetic unit and one end in the first direction of the second magnetic unit;

a read/write unit including a nonmagnetic layer and a pinned layer, the nonmagnetic layer being connected to the third magnetic unit, the pinned layer being connected to the nonmagnetic layer;

a first electrode connected to one other end in the first direction of the first magnetic unit;

a second electrode connected to one other end in the first direction of the second magnetic unit; and a third electrode connected to the read/write unit, the method for operating the magnetic memory element including causing the magnetic domains of the first magnetic unit and the magnetic domains of the second magnetic unit to move by causing a current to flow between the first electrode and the second electrode.

Note 2

The method for operating the magnetic memory element according to note 1, wherein the magnetization direction of the third magnetic unit is controlled by causing a current to flow between the third electrode and at least one of the first electrode or the second electrode after the movement of the magnetic domains of the first magnetic unit and the magnetic domains of the second magnetic unit.

Note 3

The method for operating the magnetic memory element according to note 1, wherein the magnetization direction of the third magnetic unit is sensed by causing a current to flow between the third electrode and at least one of the first electrode or the second electrode after the movement of the magnetic domains of the first magnetic unit and the magnetic domains of the second magnetic unit.

Note 4

A method for operating a magnetic memory element, the magnetic memory element including:

a first magnetic unit extending in a first direction, having an easy magnetization axis in a direction intersecting the first direction, and being capable of retaining multiple magnetic domains in the first direction;

a second magnetic unit provided to be separated from the first magnetic unit, the second magnetic unit extending in the first direction, having an easy magnetization axis in a direction intersecting the first direction, and being capable of retaining multiple magnetic domains in the first direction;

a third magnetic unit extending in a second direction intersecting the first direction, the third magnetic unit being connected to one end in the first direction of the first magnetic unit and one end in the first direction of the second magnetic unit;

a read/write unit including a nonmagnetic layer and a pinned layer, the nonmagnetic layer being connected to the third magnetic unit, the pinned layer being connected to the nonmagnetic layer;

a first electrode connected to one other end in the first direction of the first magnetic unit;

a second electrode connected to one other end in the first direction of the second magnetic unit; and a third electrode connected to the read/write unit, the method for operating the magnetic memory element including controlling the magnetization direction of the third magnetic unit by causing a current to flow between the third electrode and at least one of the first electrode or the second electrode.

Note 5

A method for operating a magnetic memory element according to note 4, wherein the magnetic domains of the first magnetic unit and the magnetic domains of the second magnetic unit are caused to move by causing a current to flow between the first electrode and the second electrode after the controlling of the magnetization direction of the third magnetic unit.

Note 6

A method for operating a magnetic memory element, the magnetic memory element including:

a first magnetic unit extending in a first direction, having an easy magnetization axis in a direction intersecting the first direction, and being capable of retaining multiple magnetic domains in the first direction;

a second magnetic unit provided to be separated from the first magnetic unit, the second magnetic unit extending in the first direction, having an easy magnetization axis in a direction intersecting the first direction, and being capable of retaining multiple magnetic domains in the first direction;

a third magnetic unit extending in a second direction intersecting the first direction, the third magnetic unit being connected to one end in the first direction of the first magnetic unit and one end in the first direction of the second magnetic unit;

a read/write unit including a nonmagnetic layer and a pinned layer, the nonmagnetic layer being connected to the third magnetic unit, the pinned layer being connected to the nonmagnetic layer;

a first electrode connected to one other end in the first direction of the first magnetic unit;

a second electrode connected to one other end in the first direction of the second magnetic unit; and a third electrode connected to the read/write unit, the method for operating the magnetic memory element including sensing the magnetization direction of the third magnetic unit by causing a current to flow between the third electrode and at least one of the first electrode or the second electrode.

Note 7

The method for operating the magnetic memory element according to note 6, wherein the magnetic domains of the first magnetic unit and the magnetic domains of the second magnetic unit are caused to move by causing a current to flow between the first electrode and the second electrode after the sensing of the magnetization direction of the third magnetic unit.

Note 8

A method for manufacturing a magnetic memory element, including:

forming a first insulating layer on a substrate;

making an opening in the first insulating layer, the opening extending in a third direction;

forming a magnetic film on the substrate and on the first insulating layer having the opening;

forming a second insulating layer by filling an insulating material into the opening of the first insulating layer where the magnetic film is formed, at least a portion of the magnetic film being buried in an interior of the second insulating layer;

forming multiple magnetic units separated from each other in the third direction by making an opening in the second insulating layer, the opening extending in the second direction intersecting the third direction;

forming a third insulating layer by filling an insulating material into the opening of the second insulating layer, the multiple magnetic units being buried in the third insulating layer; and forming a magnetic layer, a nonmagnetic layer, and a pinned layer in order on the third insulating layer to overlap at least two of the magnetic units of the multiple magnetic units as viewed from a direction intersecting the second direction and the third direction.

Note 9

A method for manufacturing a magnetic memory element, Including:

forming a first insulating layer on a substrate, the substrate including a pinned layer, a nonmagnetic layer, and a magnetic layer formed in order from below;

making an opening in the first insulating layer to expose two ends in a second direction of the magnetic layer, the opening extending in a third direction intersecting the second direction;

forming a magnetic film on the substrate and on the insulating layer having the opening, the magnetic film contacting the two ends in the second direction of the magnetic layer;

forming a second insulating layer by filling an Insulating material into the opening of the insulating layer where the magnetic film is formed, at least a portion of the magnetic film being buried in an interior of the second insulating layer; and forming multiple magnetic units separated from each other in the third direction by making an opening in the second insulating layer to cause the second Insulating layer on the magnetic layer to remain, the opening extending in the second direction.

Note 10

The method for manufacturing the magnetic memory element according to note 8 or 9, wherein the magnetic film formed at an upper surface of the first insulating layer and at a bottom of the opening extending in the third direction is removed after the forming of the magnetic film and prior to the forming of the second insulating layer.

Note 11

The method for manufacturing the magnetic memory element according to any one of notes 8 to 10, wherein the first insulating layer is formed by alternately stacking two or more films having mutually-different anisotropies for an etching rate, the opening extending in the third direction is made by RIE, and the opening of the first insulating layer includes portions having narrow dimensions in the second direction, the portions being provided periodically in the first direction.

Note 12 The method for manufacturing the magnetic memory element according to any one of notes 8 to 11, wherein the magnetic film is formed to have the easy magnetization axis in the second direction.

Note 13

A magnetic memory element, including:

a structural body array including structural bodies multiply arranged in a direction intersecting a first direction, each of the structural bodies including a first magnetic unit extending in the first direction, having an easy magnetization axis in a direction intersecting the first direction, and being capable of retaining multiple magnetic domains in the first direction, a second magnetic unit provided to be separated from the first magnetic unit, the second magnetic unit extending in the first direction, having an easy magnetization axis in a direction intersecting the first direction, and being capable of retaining multiple magnetic domains in the first direction, and a third magnetic unit extending in a direction intersecting the first direction, the third magnetic unit being connected to one end in the first direction of the first magnetic unit and one end in the first direction of the second magnetic unit;

a fourth magnetic unit connected to the first magnetic unit of the structural body and the second magnetic unit of one other structural body adjacent to the structural body;

a read/write unit provided on at least one of the third magnetic units of the multiple structural bodies;

a first electrode connected to one other end in the first direction of the first magnetic unit not connected to the fourth magnetic unit;

a second electrode connected to one other end in the first direction of the second magnetic unit not connected to the fourth magnetic unit;

a third electrode connected to the read/write unit;

a first current source causing a current to flow between the third electrode and at least one of the first electrode or the second electrode; and a second current source causing a current to flow between the first electrode and the second electrode.

Note 14

A magnetic memory element, including:

a structural body array including structural bodies multiply arranged in a direction intersecting a first direction, each of the structural bodies including a first magnetic unit extending in the first direction, having an easy magnetization axis in a direction intersecting the first direction, and being capable of retaining multiple magnetic domains in the first direction, a second magnetic unit provided to be separated from the first magnetic unit, the second magnetic unit extending in the first direction, having an easy magnetization axis in a direction intersecting the first direction, and being capable of retaining multiple magnetic domains in the first direction, and a third magnetic unit extending in a direction intersecting the first direction, the third magnetic unit being connected to one end in the first direction of the first magnetic unit and one end in the first direction of the second magnetic unit;

a fourth magnetic unit connected to the first magnetic unit of the structural body and the second magnetic unit of one other structural body adjacent to the structural body;

a read-out unit provided on at least one of the third magnetic units of the multiple structural bodies;

a write unit provided on at least one of the third magnetic units of the multiple structural bodies other than the third magnetic unit where the read-out unit is provided;

a first electrode connected to one other end in the first direction of the first magnetic unit not connected to the fourth magnetic unit;

a second electrode connected to one other end in the first direction of the second magnetic unit not connected to the fourth magnetic unit;

a third electrode connected to the read-out unit;

a fourth electrode connected to the write unit;

a first current source causing a current to flow between the third electrode and at least one of the first electrode or the second electrode;

a second current source causing a current to flow between the fourth electrode and at least one of the first electrode or the second electrode; and a third current source causing a current to flow between the first electrode and the second electrode.

Hereinabove, embodiments of the invention are described with reference to specific examples. However, the invention is not limited to these specific examples. For example, one skilled in the art may similarly practice the invention by appropriately selecting specific configurations of components such as the magnetic units, the nonmagnetic layer, the pinned layer, the electrodes, the current source circuit, the resistance value sensor, the selector, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory elements and magnetic memories practicable by an appropriate design modification by one skilled in the art based on the magnetic memory elements and magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element, comprising:

a first magnetic unit extending in a first direction, having an easy magnetization axis in a direction intersecting the first direction, and being capable of retaining a plurality of magnetic domains in the first direction;

a second magnetic unit provided to be separated from the first magnetic unit, the second magnetic unit extending in the first direction, having an easy magnetization axis in a direction intersecting the first direction, and being capable of retaining a plurality of magnetic domains in the first direction;

a third magnetic unit connected to one end in the first direction of the first magnetic unit and one end in the first direction of the second magnetic unit, the third magnetic unit having an easy magnetization axis in a second direction intersecting the first direction;

a read/write unit including a nonmagnetic layer and a pinned layer, the nonmagnetic layer being connected to the third magnetic unit, the pinned layer being connected to the nonmagnetic layer;

a first electrode connected to one other end in the first direction of the first magnetic unit;

a second electrode connected to one other end in the first direction of the second magnetic unit;

a third electrode connected to the read/write unit;

a first current source causing a current to flow between the third electrode and at least one of the first electrode or the second electrode; and a second current source causing a current to flow between the first electrode and the second electrode.

2. The element according to claim 1, wherein a surface area of the third magnetic unit is equal to a surface area of the pinned layer or less than the surface area of the pinned layer as viewed from the first direction.

3. The element according to claim 1, wherein the first magnetic unit and the pinned layer overlap as viewed from the first direction, and the second magnetic unit and the pinned layer overlap as viewed from the first direction.

4. The element according to claim 1, wherein the easy magnetization axes of the first magnetic unit and the second magnetic unit are in a direction orthogonal to the first direction, and the second direction is a direction orthogonal to the first direction.

5. The element according to claim 1, wherein a dimension in the second direction of the third magnetic unit is 200 nm or less.

6. The element according to claim 1, wherein the third magnetic unit has a single magnetic domain structure.

7. The element according to claim 1, wherein the first magnetic unit and the second magnetic unit include a magnetic alloy including at least one selected from the group consisting of cobalt, manganese, chrome, and a rare-earth element.

8. The element according to claim 1, wherein a magnetization of the third magnetic unit is smaller than a magnetization of the first magnetic unit and smaller than a magnetization of the second magnetic unit.

9. The element according to claim 1, wherein the first magnetic unit and the second magnetic unit are formed as films by CVD or ALD.

10. The element according to claim 1, wherein the third magnetic unit extends in the second direction.

11. The element according to claim 1, wherein the first magnetic unit and the second magnetic unit have portions having narrow dimensions in the second direction, the portions being provided periodically in the first direction.

12. The element according to claim 1, wherein a surface area of a connection surface between the first magnetic unit and the third magnetic unit is less than a cross-sectional area of a surface of the first magnetic unit orthogonal to the first direction, and a surface area of a connection surface between the second magnetic unit and the third magnetic unit is less than a cross-sectional area of a surface of the second magnetic unit orthogonal to the first direction.

13. The element according to claim 1, further comprising:
a fourth magnetic unit provided to be separated from the first magnetic unit and the second magnetic unit, the fourth magnetic unit extending in the first direction, having an easy magnetization axis in a direction intersecting the first direction, and being capable of retaining a plurality of magnetic domains in the first direction, one end in the first direction of the fourth magnetic unit being connected to the third magnetic unit;
a fifth magnetic unit provided to be separated from the first magnetic unit, the second magnetic unit, and the fourth magnetic unit, the fifth magnetic unit extending in the first direction, having an easy magnetization axis in a direction intersecting the first direction, and being capable of retaining a plurality of magnetic domains in the first direction, one end in the first direction of the fifth magnetic unit being connected to the third magnetic unit;
a fourth electrode connected to one other end in the first direction of the fourth magnetic unit; and
a fifth electrode connected to one other end in the first direction of the fifth magnetic unit.

14. A magnetic memory element, comprising:
a first magnetic unit extending in a first direction, having an easy magnetization axis in a direction intersecting the first direction, and being capable of retaining a plurality of magnetic domains in the first direction;
a second magnetic unit provided to be separated from the first magnetic unit, the second magnetic unit extending in the first direction, having an easy magnetization axis in a direction intersecting the first direction, and being capable of retaining a plurality of magnetic domains in the first direction;
a third magnetic unit extending in a direction intersecting the first direction and being connected to one end in the first direction of the first magnetic unit and one end in the first direction of the second magnetic unit;
a read/write unit including a nonmagnetic layer and a pinned layer, the nonmagnetic layer being connected to the third magnetic unit, the pinned layer being connected to the nonmagnetic layer;
a first electrode connected to one other end in the first direction of the first magnetic unit;
a second electrode connected to one other end in the first direction of the second magnetic unit;
a third electrode connected to the read/write unit;
a fourth electrode connected to the third magnetic unit and provided in a region not between the first magnetic unit and the second magnetic unit;
a first current source causing a current to flow between the third electrode and the fourth electrode to perform reading and writing of a magnetization direction of the third magnetic unit; and
a second current source causing a current to flow between the first electrode and the second electrode to move the magnetic domains of the first magnetic unit and the second magnetic unit.

15. The element according to claim 14, wherein the fourth electrode is provided to contact both a vicinity of a connection portion of the first magnetic unit for the first magnetic unit and the third magnetic unit and a vicinity of a connection portion of the second magnetic unit for the second magnetic unit and the third magnetic unit.

16. A magnetic memory, comprising:
a plurality of the magnetic memory elements according to claim 1;
a plurality of first bit lines, each of the plurality of first bit lines being connected to the third electrode corresponding to the first bit line;
a plurality of first transistors, each of the plurality of first transistors including a gate connected to a first word line corresponding to the first transistor, one terminal other than the gate connected to the first electrode corresponding to the first transistor, and one other terminal other than the gate connected to a second bit line corresponding to the first transistor; and
a plurality of second transistors, each of the plurality of second transistors including a gate connected to a second word line corresponding to the second transistor, one terminal other than the gate connected to the second electrode corresponding to the second transistor, and one other terminal other than the gate connected to a third bit line corresponding to the second transistor.

17. A magnetic memory, comprising:
a plurality of the magnetic memory elements according to claim 14;
a plurality of first bit lines, each of the plurality of first bit lines being connected to the third electrode corresponding to the first bit line;
a plurality of fourth bit lines, each of the plurality of fourth bit lines being connected to the fourth electrode corresponding to the fourth bit line;
a plurality of first transistors, each of the plurality of first transistors including a gate connected to a first word line corresponding to the first transistor, one terminal other than the gate connected to the first electrode corresponding to the first transistor, and one other terminal other than the gate connected to a second bit line corresponding to the first transistor; and
a plurality of second transistors, each of the plurality of second transistors including a gate connected to a second word line corresponding to the second transistor, one terminal other than the gate connected to the second electrode corresponding to the second transistor, and one other terminal other than the gate connected to a third bit line corresponding to the second transistor.

* * * * *